United States Patent
Naumenko et al.

(10) Patent No.: US 6,556,104 B2
(45) Date of Patent: Apr. 29, 2003

(54) SURFACE ACOUSTIC WAVE DEVICES USING OPTIMIZED CUTS OF A PIEZOELECTRIC SUBSTRATE

(75) Inventors: Natalya F. Naumenko, Moscow (RU); Benjamin P. Abbott, Orlando, FL (US)

(73) Assignee: Sawtek, Inc., Orlando, FL (US)

( * ) Notice: Subject to any disclaimer, the term of this patent is extended or adjusted under 35 U.S.C. 154(b) by 0 days.

(21) Appl. No.: 09/848,714

(22) Filed: May 3, 2001

(65) Prior Publication Data

US 2002/0067227 A1 Jun. 6, 2002

Related U.S. Application Data

(60) Provisional application No. 60/229,523, filed on Aug. 31, 2000.

(51) Int. Cl.$^7$ .............................. H03H 9/64; H03H 9/25
(52) U.S. Cl. .................................... 333/193; 310/313 A
(58) Field of Search ................................. 333/193–196; 310/313 A

(56) References Cited

U.S. PATENT DOCUMENTS

| | | | | |
|---|---|---|---|---|
| 4,001,767 A | * | 1/1977 | Slobodnik, Jr. | 310/313 A |
| 5,081,389 A | * | 1/1992 | Abbott et al. | 310/313 A |
| 5,760,522 A | * | 6/1998 | Kobayashi et al. | 310/313 A |
| 5,854,527 A | * | 12/1998 | Shimizu et al. | 310/313 A |
| 5,874,869 A |   | 2/1999 | Ueda et al. | 333/193 |
| 6,037,699 A |   | 3/2000 | Kobayashi et al. | 310/313 A |
| 6,037,847 A |   | 3/2000 | Ueda et al. | 333/193 |
| 6,366,002 B1 | * | 4/2002 | Kadota | 310/313 A |

FOREIGN PATENT DOCUMENTS

| | | | |
|---|---|---|---|
| JP | 8-316781 | * | 11/1996 |
| JP | 8-340234 | * | 12/1996 |
| JP | 9-167936 | * | 6/1997 |
| JP | 9-331229 | * | 12/1997 |

OTHER PUBLICATIONS

Koskela, J., et al., "Supression of the Leaky SAW Attenuation with Heavy Mechanical Loading," IEEE Transactions on Ultrasonics, Ferroelectrics and Frequency control, vol. 45, No. 2, Mar. 1998, 439–449.

Kobayashi Y., et al., "1.9–GHz–Band Surface Acoustic Wave Device Using Second Leaky Wave on $LiTaO_3$ and $LiNbO_3$," Proceedings of the 1996 IEEE International Frequency Control Symposium, pp. 240–247, Jun., 1996.

Isobe, A., et al., Propagation Characteristics of Longitudinal Leaky SAW in Al–Grating Structure, Proceedings of the 1997 IEEE Ultrasonics Symposium, pp. 17–21, Oct., 1997.

Knuuttila J.V., et al., "Asymmetric Acoustic Radiation in Leaky SAW Resonators on Lithium Tantaltate," Proceedings of the 1999 IEEE Ultrasonics Symposium, pp. 83–86, Oct., 1999.

* cited by examiner

Primary Examiner—Barbara Summons
(74) Attorney, Agent, or Firm—Allen, Dyer, Doppelt, Milbrath & Gilchrist, P.A.

(57) ABSTRACT

A surface acoustic wave device includes a piezoelectric substrate of a single crystal $LiTaO_3$ and an electrode pattern provided on a surface of the piezoelectric substrate which forms a resonator having an electrode thickness in a range of about 1% to about 15% of an acoustic wavelength of a surface acoustic wave excited on the surface of the substrate. The piezoelectric substrate has an orientation defined by Euler angles ($\lambda$, $\mu$, $\theta$), with angle $\lambda$ in a range from $-4°$ to $+4°$, angle $\mu$ in a range from about $-52°$ to about $-36°$, and angle $\theta$ in a range from about $(-1.365 \lambda -4)°$ to $(-1.365 \lambda +4)°$. Such orientations simultaneously combined with an optimized propagation loss at resonant and anti-resonant frequencies provide for improved performance in RF applications.

19 Claims, 19 Drawing Sheets

SURFACE ACOUSTIC WAVE DEVICES USING OPTIMIZED CUTS OF A PIEZOELECTRIC SUBSTRATE

CROSS-REFERENCE TO RELATED APPLICATIONS

This application claims priority to and incorporates by reference co-pending application Ser. No. 60/229,523, filed Aug. 31, 2000, commonly owned with the present application.

FIELD OF THE INVENTION

The present invention relates generally to surface acoustic wave (SAW) devices and more particularly to a SAW device having improved performance characteristics for application to RF filtering for wireless communications.

BACKGROUND OF THE INVENTION

High frequency surface acoustic wave (SAW) devices are widely used in wireless communications products, particularly as radio frequency (RF) filters for transmit and receive operations. Such filters often utilize resonant SAW devices formed on single crystal piezoelectric substrates as components to generate the desired filtering function. One single crystal piezoelectric substrate, which is commonly used for RF filters, and which has some desirable characteristics for such filters, is lithium tantalate ($LiTaO_3$). The performance characteristics of any crystal substrate vary with the selected wave propagation direction, which can be defined in terms of Euler angles. A particularly desirable cut for certain applications is described by Ueda et. al. in U.S. Pat. No. 6,037,847 and U.S. Pat. No. 5,874,869. U.S. Pat. No. 6,037,847 teaches the use of $LiTaO_3$ with Euler angles $(\lambda,\mu,\theta)$ such that $\lambda$ and $\theta$ fixed (set at zero), and $\mu$ varied depending on the metalization type and thickness used. For an electrode pattern containing Al as a primary component and forming a resonator with thickness in the range of 0.03–0.15 times a wavelength $\Lambda$ (i.e. 3% $\Lambda$ to 15% $\Lambda$), the preferred rotation angle $\mu$ is greater than −51°, which corresponds to 39°-rotated YX-cut, and less than −44°, which corresponds to 46°-rotated YX-cut (the angle of rotation of Y-cut is determined as $\mu'=\mu+90°$). Additional restrictions are presented indicating that the range of Euler angles with rotational angle $\mu$ centered on −48° (42°-rotated YX-cut) is preferred. For electrode patterns having Cu as a primary component, with electrode thickness of 0.9% $\Lambda$ to 4.5% $\Lambda$, a rotational angle $\mu$ greater than −51° but less than −44° is selected. For electrode patterns containing Au as a primary component and having thickness in the range of 0.4% $\Lambda$ to 2.1% $\Lambda$, a rotational angle $\mu$ greater than −51° but less than −44° is selected. As a result, Ueda '847 uses a rotational angle $\mu$ in ranges greater than −51° but less than −44°. U.S. Pat. No. 5,874,869 teaches the use of $LiTaO_3$ with Euler Angles $\lambda$ and $\theta$ fixed (nominally zero), and $\mu$ in a range between −50° and −48° for multi-mode SAW devices with a range of specific device design characteristics.

While the Ueda '847 and '869 patents do not specifically state values for Euler angles $\lambda$ and $\theta$, the description of piezoelectric substrate having an orientation rotated about an X-axis thereof, from a Y-axis thereof, toward a Z-axis thereof, with a rotational angle in a specified range, and the direction of propagation of the surface acoustic wave set in the X-direction would lead one skilled in the art to appreciate that the first Euler angle $\lambda$ and the third Euler angle $\theta$ are equal to zero.

SAW devices built on the aforementioned orientations of $LiTaO_3$ utilize leaky surface acoustic waves (LSAW). A leaky wave has higher propagation velocity, as compared to SAW, which is an advantageous feature for high-frequency SAW devices. Though normally a leaky wave propagates along crystal surface with non-zero attenuation, caused by radiation of bulk acoustic waves into the bulk of crystal, under certain conditions this attenuation tends to zero. One class of leaky waves having negligible attenuation is quasi-bulk waves. With a free surface of a crystal, the mechanical boundary condition can be satisfied for a bulk wave propagating along the boundary plane and polarized in this plane, thus called horizontally polarized wave. In any crystal, orientations in which one of bulk waves satisfies mechanical boundary conditions, form lines in crystallographic space defined by three Euler angles. For $LiTaO_3$, such orientations were previously discussed in a publication by N. F. Naumenko, Sov. Phys.-Crystallography 37, pp. 220–223, 1992. In particular, it was found that one of these orientations is known as 36°-rotated YX-cut, Euler angles (0°, −54°, 0°). This is a symmetric orientation characterized by the propagation direction parallel to X axis and a normal to the boundary plane lying in the plane of reflection symmetry YZ of $LiTaO_3$. The fast shear bulk wave propagating along X-axis and polarized in the plane of 36°-rotated YX-cut is strongly piezoelectrically coupled with the electric field component along X-axis, due to proximity of the corresponding effective piezoelectric module to its absolute maximum for $LiTaO_3$. As to the promising characteristics of 36°-rotated YX-cut for application in SAW devices, reference should be made to K. Nakamura et al., Proc. 1977 IEEE Ultrasonics Symposium, pp. 819–822.

Electrical boundary conditions change the nature of the bulk wave and make it quasi-bulk with propagation velocity slightly lower than that of the bulk wave. The effect of mass loading and electric boundary conditions in an electrode pattern disposed on the surface of 36°-rotated YX cut results in increasing attenuation or propagation loss. However, as described in U.S. Pat. No. 6,037,847 to Ueda et al., orientation with nearly zero propagation loss does not disappear but continuously moves from 36°YX to 42°YX cut while Al electrode thickness increases from zero to 0.08Λ. Similarly, orientations with zero LSAW attenuation were found for electrode patterns containing Cu or Au as a primary component, as functions of metal thickness. According to the detailed description of a method used for evaluation of propagation loss due to scattering of LSAW into slow shear bulk waves, reported by Hashimoto (K. Hashimoto et al., Proc. 1997 IEEE Ultrasonics Symposium, pp. 245–254), minimum propagation loss at the lower edge of a stopband of Bragg's reflection, which corresponds to the resonant frequency of LSAW resonator, was chosen as a criterion of optimizing cut angle. However, propagation loss is a function of frequency. Thus, it is desirable to minimize its average value in a bandwidth. As will be seen, the present invention minimizes propagation loss simultaneously at resonant (fr) and anti-resonant (fa) frequencies.

To explain the effect of propagation loss on a filter performance, reference is now made to FIG. 1, which is an example of a ladder filter, comprising three shunt (R4,R5, R6) and three series (R1, R2, R3) resonant SAW structures and utilizing 42°-rotated YX-Cut $LiTaO_3$ substrate. For the devices under consideration, resonant SAW structures are used as both series and as parallel (shunt) components within a composite device structure, which may include lattice-like regions. In ladder filters it is common to have the anti-resonant frequency of the shunt elements approximately equal to the resonant frequency of the series elements. The lower passband edge of a filter is then determined by propagation loss at the resonant frequency of the shunt elements and the upper passband edge is determined by the propagation loss at the anti-resonance of the series elements. Thus, the propagation loss at both frequencies, resonant and anti-resonant one, are significant and it is desirable that they be simultaneously minimized.

FIG. 2 shows propagation loss at resonant and anti-resonant frequencies calculated for 42°-rotated YX cut $LiTaO_3$ with Al as electrode material, as functions of electrode thickness normalized to LSAW wavelength, $h/\Lambda$. These and other calculations were made with material constants of $LiTaO_3$ reported by Taziev (R. M. Taziev et al., Proc. 1994 IEEE Ultrasonics Symposium, pp.415–419), though it was found that the results do not change significantly if another set of material constants is used, for example, the constants reported by Kovacs (G. Kovacs et al. Proc. 1990 IEEE Ultrasonics Symposium, pp.435–438).

By way of example, let an electrode thickness of 10% $\Lambda$. In recent RF filters, especially for GHz applications, such electrode thickness is rather conventional due to high operating frequencies and hence short wavelengths. While propagation loss at resonant frequency is fairly low, about 0.003 dB/$\Lambda$, at anti-resonance it is about 0.03 dB/$\Lambda$, which is 10 times higher. As a result, a frequency response of a filter is expected to be non-symmetric, with larger degradation of a high-frequency passband edge, and increased shape factor. FIG. 3 illustrates the effect of propagation loss at resonance and anti-resonance on SAW filter performance and demonstrates that if propagation loss is minimized at average frequency fo=(fr+fa)/2, lower insertion loss and better shape factor can be provided, as compared to the cases when propagation loss is minimized either at resonant or at anti-resonant frequency. A more desirable shape factor is expected due to wider bandwidth and steeper edges of the passband.

In view of the aforementioned, one purpose of the present invention is to provide improved performance, and, in particular, to reduce insertion loss and improve shape factor, in SAW filters comprising resonator-type elements, using selected orientations of $LiTaO_3$ with simultaneously optimized propagation loss at resonant and anti-resonant frequencies, while the electrode thickness varies in a wide range from 1% $\Lambda$ to 15% $\Lambda$.

In particular, there is a strong need to provide substrate cuts with fairly low propagation loss (desirably less than 0.01 dB/$\Lambda$) in the interval of thicknesses from 8% $\Lambda$ to 15% $\Lambda$, for an electrode pattern with Al as a primary component. According to FIG. 13 of U.S. Pat. No. 6,037,847, if an electrode thickness exceeds 8% $\Lambda$, no $LiTaO_3$ orientation in the interval from 36°-YX to 46°-YX can provide as low a propagation loss as it is in a 42°YX cut with Al thickness 7.5% $\Lambda$. For example, with 10% Al thickness, minimum propagation loss was found to be about 0.01 dB/$\Lambda$. Further, there is a need for substrate cuts with optimized propagation loss when Au is utilized as a primary component of electrode material, with electrode thickness in the range from 1.5% $\Lambda$ to 2.5% $\Lambda$ and with Cu utilized as a primary component of electrode material, when electrode thickness is in the range from 3% $\Lambda$ to 6% $\Lambda$.

A variety of specified values of electrical parameters in RF filters for different applications requires piezoelectric substrates with different values of LSAW characteristics, in particular, different electromechanical coupling coefficients. However, the requirement of low insertion loss and high operating frequencies restricts the substrate cuts, which are commonly used in RF filters, to $\mu'$-rotated YX-cuts of $LiNbO_3$ and $\mu'$-rotated YX-cuts of $LiTaO_3$, with rotation angle $\mu'$ selected according to the required thickness of electrodes. On the other hand, a variety of substrate cuts with fairly low propagation loss can be provided due to non-symmetric orientations of $LiTaO_3$, defined by Euler angles $(\lambda, \mu, \theta)$ (with $\lambda$ and $\theta$ being nonzero). By the example of 36°–42° rotated Y-cuts of $LiTaO_3$, it was demonstrated (U.S. Pat. No. 6,037,847) that low-attenuated leaky waves of quasi-bulk nature continuously move in crystallographic space with increasing electrode thickness, rather than disappear.

The teachings of the present invention will show that such behavior is also typical for non-symmetric orientations in which the fast shear surface-skimming bulk wave (SSBW) satisfies mechanical boundary condition on a free surface. Moreover, non-symmetric orientations with optimized propagation loss form a continuous line in crystallographic space, and this line crosses a symmetric point $(0, \mu, 0)$. Therefore, locating this line can provide for adjusting the propagation direction with occasional deviation of a crystal cut plane from a symmetric orientation, in order to retain low propagation loss.

SUMMARY OF THE INVENTIONS

In view of the foregoing background, it is therefore an object of the present invention to provide a piezoelectric substrate with an optimum orientation for use in high frequency (RF) SAW devices, which can eliminate known disadvantages of the prior art substrate orientations.

Another object of the present invention is to provide a SAW device, comprising resonator-type elements, with improved performance using orientations of $LiTaO_3$ with simultaneously optimized propagation loss at resonant and anti-resonant frequencies, while electrode thickness varies in a wide range from 1% $\Lambda$ to 15% $\Lambda$, where $\Lambda$ is acoustic wavelength.

Another object of the present invention is to provide a variety of electrical parameters in SAW devices for RF applications using non-symmetric orientations defined by Euler angles $(\lambda, \mu, \theta)$ (with $\lambda$ and $\theta$ being nonzero) and having propagation loss less than 0.01 dB/$\Lambda$ and electromechanical coupling factor greater than 0.07, while electrode thickness of the pattern is larger than 1% $\Lambda$ and less than 15% $\Lambda$.

Another object of the present invention is to provide for adjusting the propagation direction with occasional deviation of a crystal cut plane from a desired symmetric orientation $(0, \mu, 0)$, to retain low propagation loss. This is achieved by finding such relationship between Euler angles $\lambda$ and $\theta$, which describes orientations $(\lambda, \mu, \theta)$ with optimized propagation loss, while the angle $\lambda$ varies from −4° to 4° and angle $\mu$ is fixed.

Another object of the present invention is to provide a SAW device comprising a piezoelectric substrate of a single crystal $LiTaO_3$ with an electrode pattern disposed on a surface of said piezoelectric substrate and forming resonator, wherein a thickness of the electrode pattern is in the range from 1% to 15% $\Lambda$ and Al is used as a primary component of electrode material, and wherein a piezoelectric substrate has orientation defined by the Euler angles $(\lambda, \mu, \theta)$, with angle $\lambda$ in the range from −40° to +40°, angle=$\mu$ in the range from −52° to −36°, and angle $\theta$ in the range from $(-1.365*\lambda-4)°$ to $(-1.365*\lambda+4)°$, wherein either angles $\lambda$ or $\theta$ are not equal to zero.

Another object of the present invention is to provide a SAW device comprising a piezoelectric substrate of a single crystal LiTaO$_3$ with an electrode pattern disposed on a surface of the piezoelectric substrate and forming resonator, wherein thickness of a said electrode pattern is in the range from 1% to 2.5% Λ and Au is used as a primary component of electrode material, and wherein a piezoelectric substrate has orientation defined by the Euler angles (λ, μ, θ), with angle λ in the range from −4° to +4°, angle μ in the range from −52° to −36°, and angle θ in the range from (−1.365*λ−4)° to (−1.365*λ+4)°, wherein either angles λ or θ are not equal to zero.

Another object of the present invention is to provide a SAW device comprising a piezoelectric substrate of a single crystal LiTaO$_3$ with an electrode pattern disposed on a surface of the piezoelectric substrate and forming a resonator, wherein a thickness of the electrode pattern is in the range from 1% to 6% Λ and Cu is used as a primary component of electrode material, and wherein a piezoelectric substrate has orientation defined by the Euler angles (λ, μ, θ), with angle λ in the range from −4° to +4°, angle μ in the range from −52° to −36°, and angle θ in the range from (−1.365*λ−4)° to (−1.365*λ+4)°, wherein either angles λ or θ are not equal to zero.

Another object of the present invention is to provide a SAW device comprising a piezoelectric substrate of a single crystal LiTaO$_3$ with an electrode pattern disposed on a surface of the piezoelectric substrate and forming a resonator, wherein a thickness of the electrode pattern is in the range from 5% to 15% Λ and Al is used as a primary component of the electrode material, and wherein a piezoelectric substrate has orientation defined by the Euler angles (0, μ, 0), with angle μ in the range from −44° to −36°.

Another object of the present invention is to provide a SAW device comprising a piezoelectric substrate of a single crystal LiTaO$_3$ with an electrode pattern disposed on a surface of the piezoelectric substrate and forming a resonator, and wherein a thickness of the electrode pattern is in the range from 1.5% to 2.5% Λ and Au is used as a primary component of electrode material, and wherein a piezoelectric substrate has orientation defined by the Euler angles (0, μ, 0), with angle μ in the range from −44° to −36°.

Another object of the present invention is to provide a SAW device comprising a piezoelectric substrate of a single crystal LiTaO$_3$ with an electrode pattern disposed on a surface of the piezoelectric substrate and forming a resonator, wherein a thickness of the electrode pattern is in the range from 3% to 6% Λ and Cu is used as a primary component of electrode material, and wherein a piezoelectric substrate has orientation defined by the Euler angles (0, μ, 0), with angle μ in the range from −44° to −36°.

DESCRIPTION OF THE PREFERRED EMBODIMENTS

Figure 4:
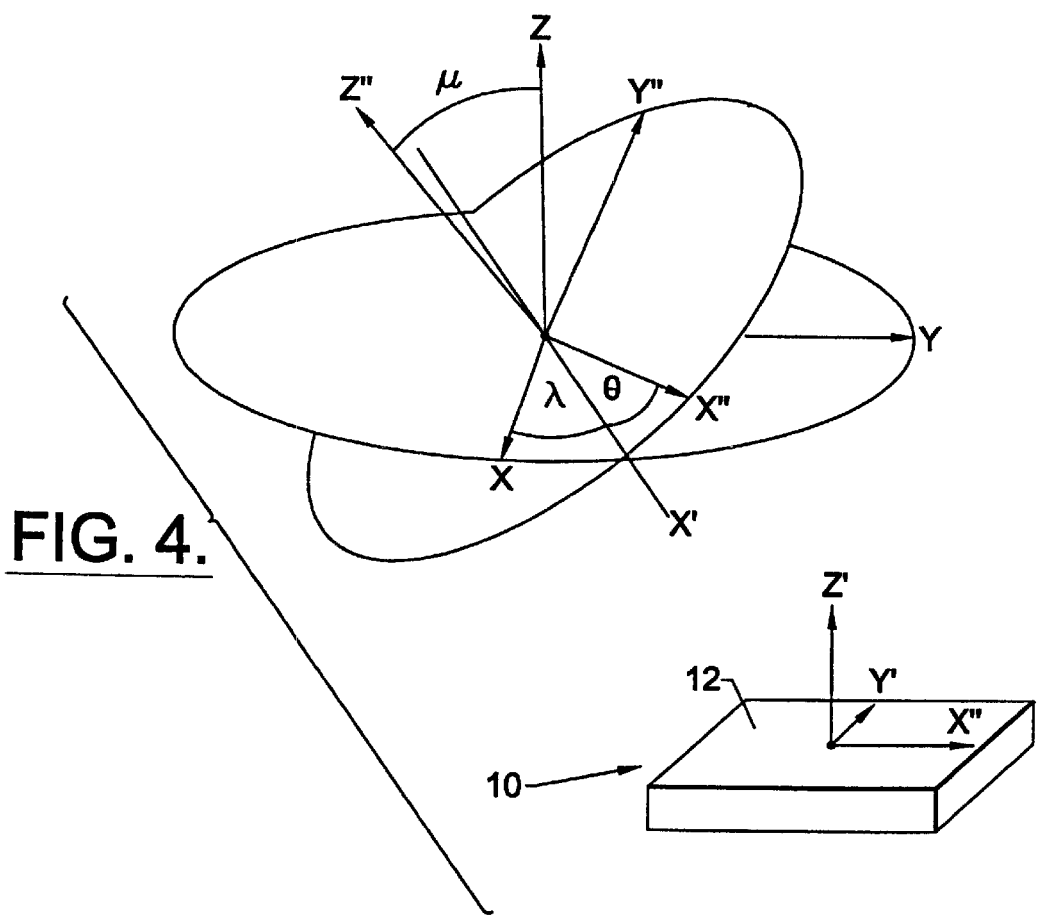
FIG. 4 diagrammatically illustrates an orientation of a crystal plane and propagation direction in this plane using Euler angles, with reference to initial crystal axes X,Y,Z.

Prior to a detailed description of preferred embodiments of the present invention, an orientation procedure will be further described in order to define a substrate cut and propagation direction of LSAW within this cut, according to the specified Euler angles (λ, μ, θ). Reference is now made to FIG. 4. With initial coordinate axes X,Y,Z fixed along crystal axes of a LiTaO$_3$ substrate 10, according to the Euler angle convention, first, auxiliary axis X' (positive direction) is obtained by rotation from positive X axis towards positive Y axis by the angle λ. The outward normal Z' to the substrate cut 12 is then found by rotation about auxiliary axis X' from positive Z axis, by the angle μ counter-clockwise, as viewed from positive X'. Finally, the direction of surface wave propagation X" is found by rotation about Z' from positive X' axis by the angle θ counterclockwise, as viewed from positive Z' axis.

It will be understood by those skilled in the art that the Euler angles herein described can have alternate positive or negative values and, as a consequence, rotations described by angles λ, μ, or θ may also be described with alternate positive or negative signs to indicate rotations in the opposite direction to arrive at the preferred surface cut to achieve a desired propagation loss as herein described.

A performance of any SAW filter comprising a piezoelectric substrate with electrode patterns, used for generation and detection of surface waves or forming resonators, is affected by propagation loss in a substrate. Though different mechanisms contribute to propagation loss, further discussions refer to propagation loss caused by the nature of leaky waves, that is by radiation of bulk waves into the bulk of a substrate. For a specified substrate cut and propagation direction, this propagation loss depends on the details of filter structure, such as metalization ratio and electrode thickness normalized to wavelength h/Λ. Searches were conducted assuming the electrode patterns contain Al, Cu or Au as a primary component, with metalization ratio a/p=0.5, and spanned a wide range of normalized electrode thickness from 1% Λ to 15% Λ. As explained above, simultaneous minimization of propagation loss at resonant and anti-resonant frequencies was used as a criterion of optimization.

Figure 5:
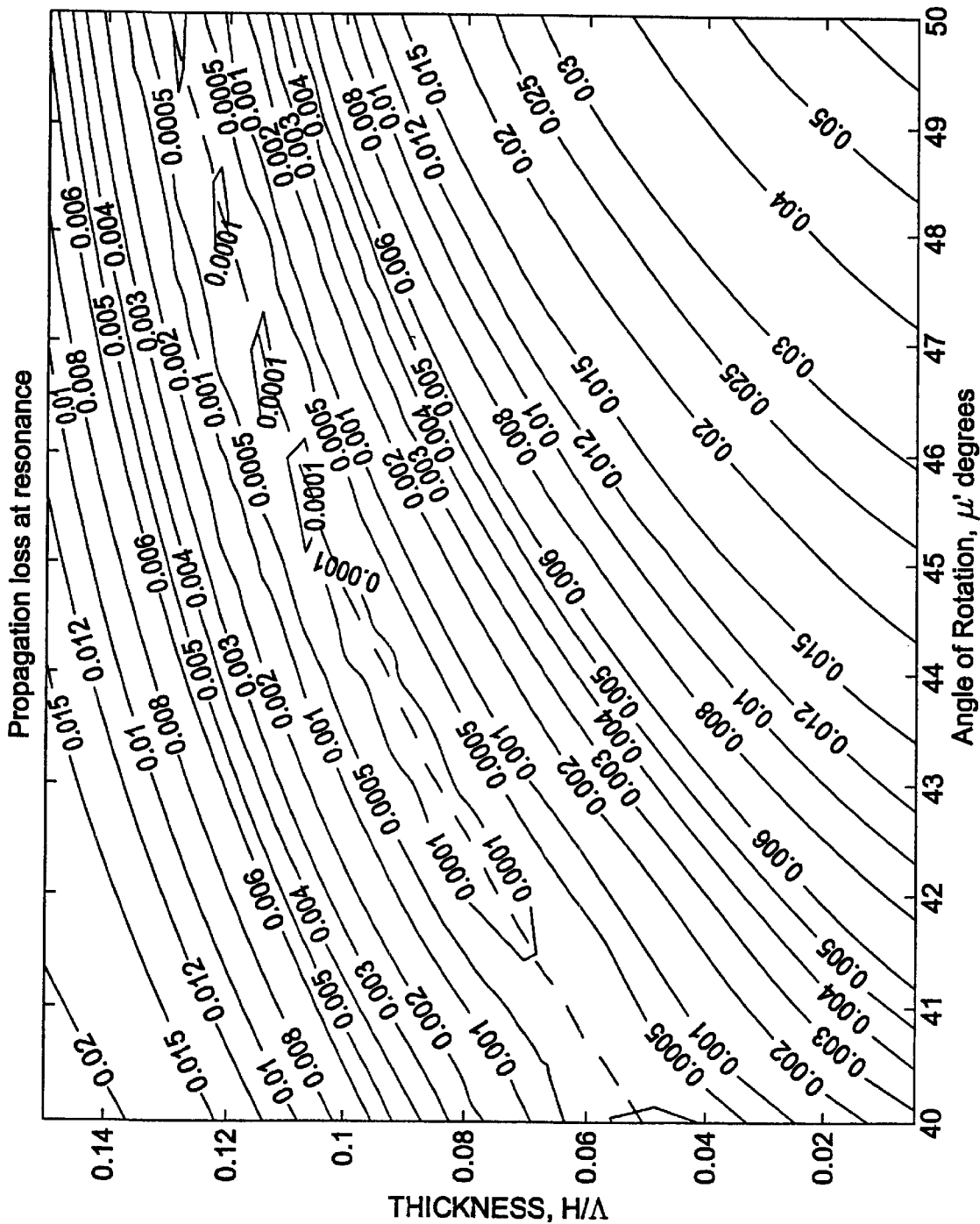
FIG. 5 is a contour plot of propagation loss at resonant frequency, as a function of cut angle μ' and a normalized electrode thickness, for a pattern having Al electrodes on μ'-rotated YX cut of LiTaO$_3$.
Figure 6:
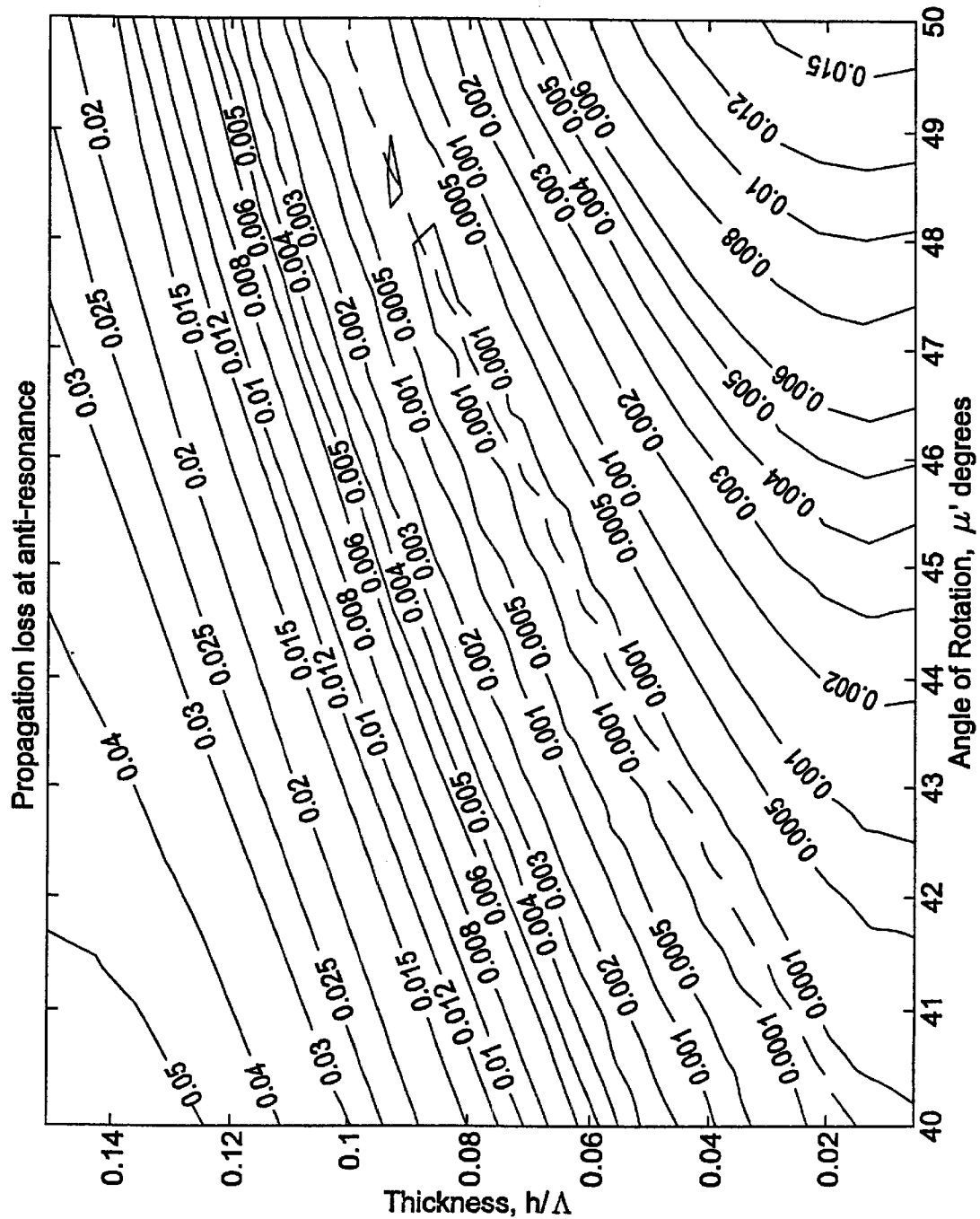
FIG. 6 is a contour plot of propagation loss at anti-resonant frequency, as a function of cut angle μ' and a normalized electrode thickness, for a pattern having Al electrodes on μ'-rotated YX cut of LiTaO$_3$.
Figure 7:
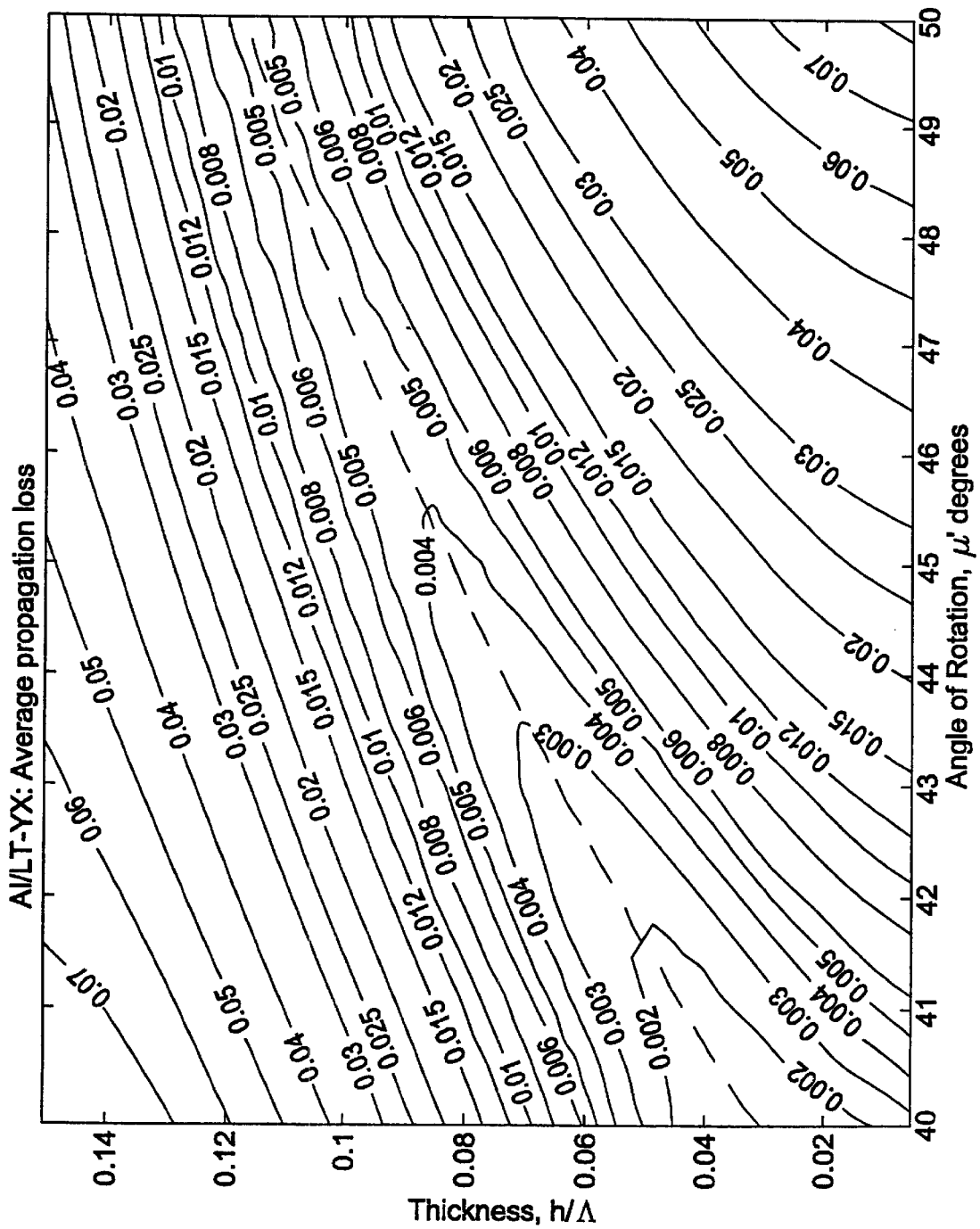
FIG. 7 is a contour plot of average propagation loss, as a function of cut angle μ' and a normalized electrode thickness, for a pattern having Al electrodes on μ'-rotated YX cut of LiTaO$_3$.

With the first and third Euler angles set equal to zero, propagation loss was calculated as a function of electrode thickness and rotation angle μ' for μ'-rotated YX-cuts of LiTaO$_3$ [Euler angles (0°, μ'+90°, 0°)], with Al as a primary component of electrode material. FIG. 5 and FIG. 6 show respectively propagation loss at resonant frequency fr and propagation loss at anti-resonant frequency fa, as contour plots. A line of minimum loss (indicated by a dashed line) is clearly seen in each plot and shows cut angle μ', providing minimum loss, as function of normalized thickness h/Λ. In FIG. 5 and FIG. 6, these dashed lines indicate different values, though are close to each other. Average propagation loss estimated approximately as (fr+fa)/2 is shown in FIG. 7. The line of minimum loss (the dashed line) determines optimal electrode thickness as function of cut angle, for SAW devices having resonant-type elements with Al as electrode material.

Figure 8:
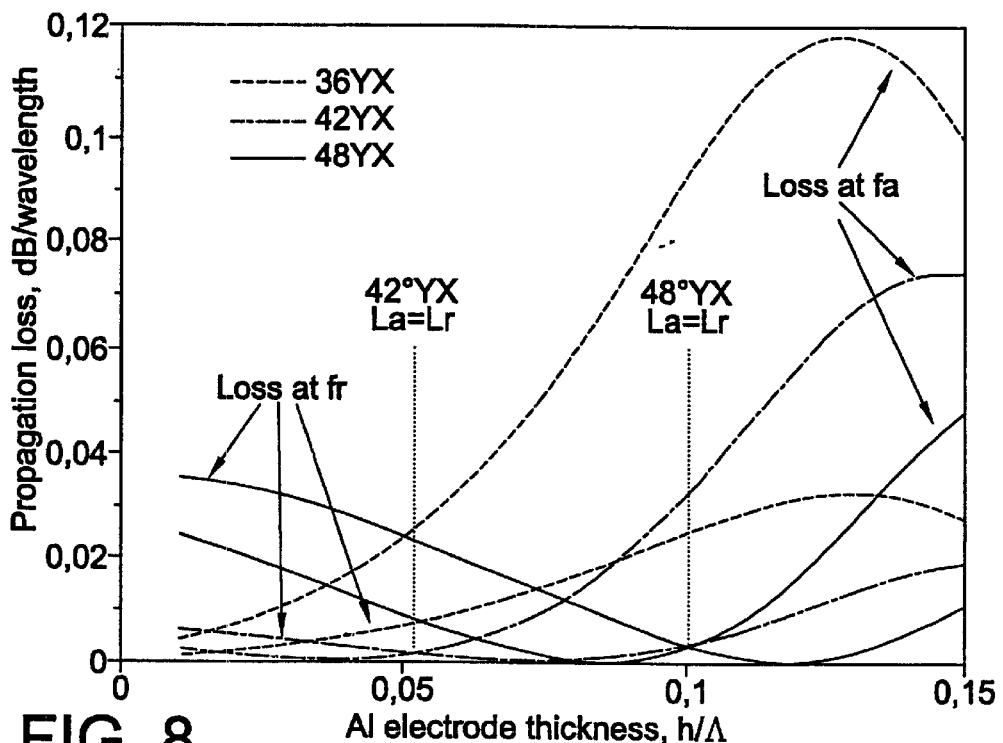
FIG. 8 graphically shows a propagation loss at resonant and anti-resonant frequencies for 36°YX, 42°YX and 48°YX cuts of LiTaO$_3$ with a pattern of Al electrodes, as function of normalized electrode thickness, wherein an average propagation loss is minimized at h/Λ≈0.05 for 42°-YX cut and at h/Λ≈0.1 for 48°-YX cut.

By way of example, one optimal orientation of LiTaO$_3$, determined from FIG. 7 for electrode thickness 10% Λ, is 48°-rotated YX-cut [Euler angles (0°, −42°, 0°)], while 42°-rotated YX cut [Euler angles (0°, −48°, 0°)] is optimal approximately for Al electrode thickness 5% Λ. FIG. 8 shows propagation losses at resonant and anti-resonant frequencies in three LiTaO$_3$ orientations, 36°YX, 42°YX and 48°YX cuts, as functions of electrode thickness. Each propagation loss versus normalized thickness dependence has a minimum with nearly zero loss value. For 42°YX cut, a minimum for the resonant frequency propagation loss occurs at about 7% Λ, and a minimum for the anti-resonant frequency propagation loss occurs at about 4% Λ. Thus, average propagation loss is minimum at approximately 5% Λ. For 48°YX cut, a minima of propagation loss at resonant and anti-resonant frequencies occurs respectively at 12% Λ and 8% Λ, and an average propagation loss is minimum at 10% Λ.

Figure 9:
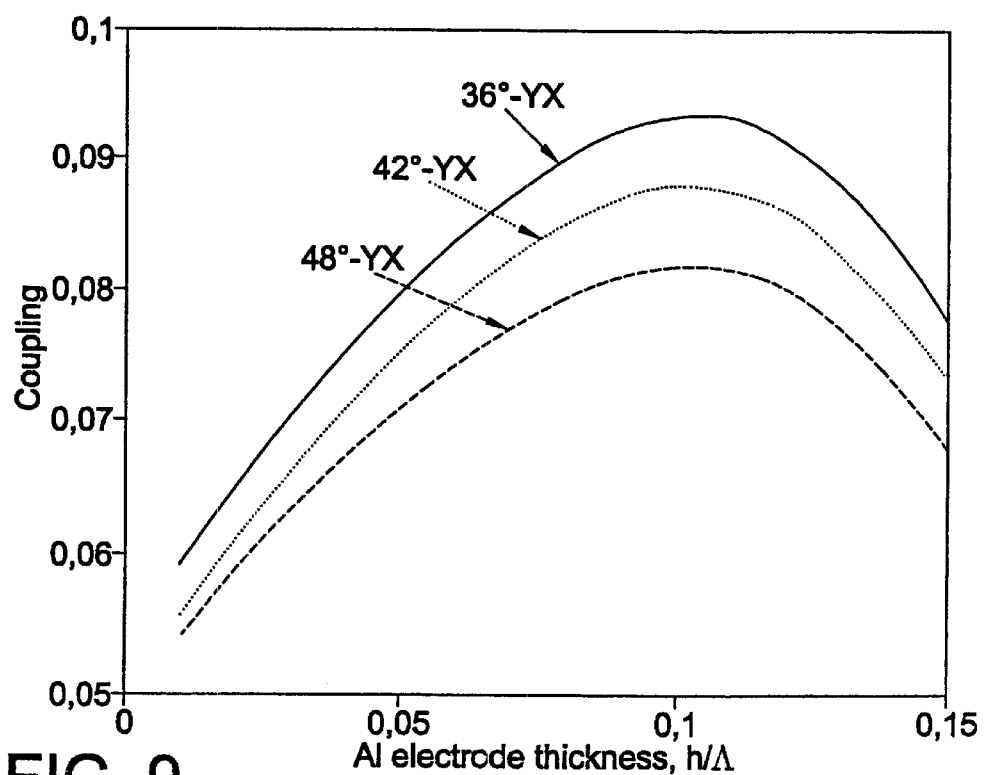
FIG. 9 graphically shows electromechanical coupling coefficient for 36°-YX, 42°-YX and 48°-YX cuts of LiTaO$_3$ with pattern of Al electrodes, as a function of a normalized electrode thickness.
Figure 10:
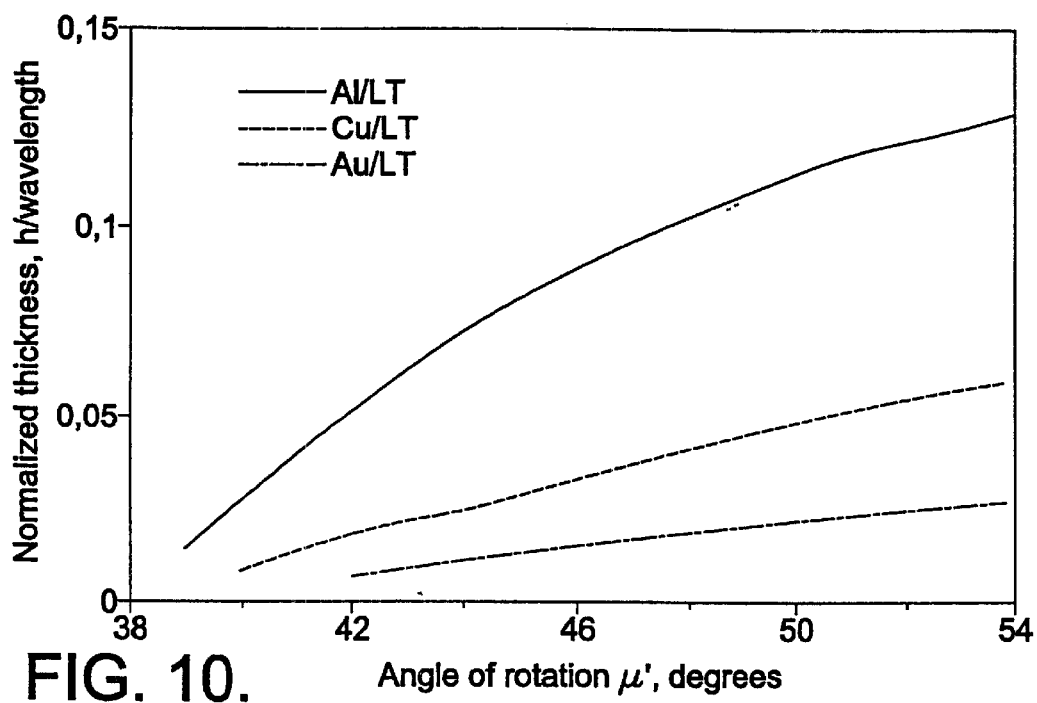
FIG. 10 is a diagram showing relationship between optimal normalized electrode thickness and cut angle μ', for μ'-rotated YX cuts of LiTaO$_3$ with Al, Cu and Au as primary components of electrode material.
Figure 11:
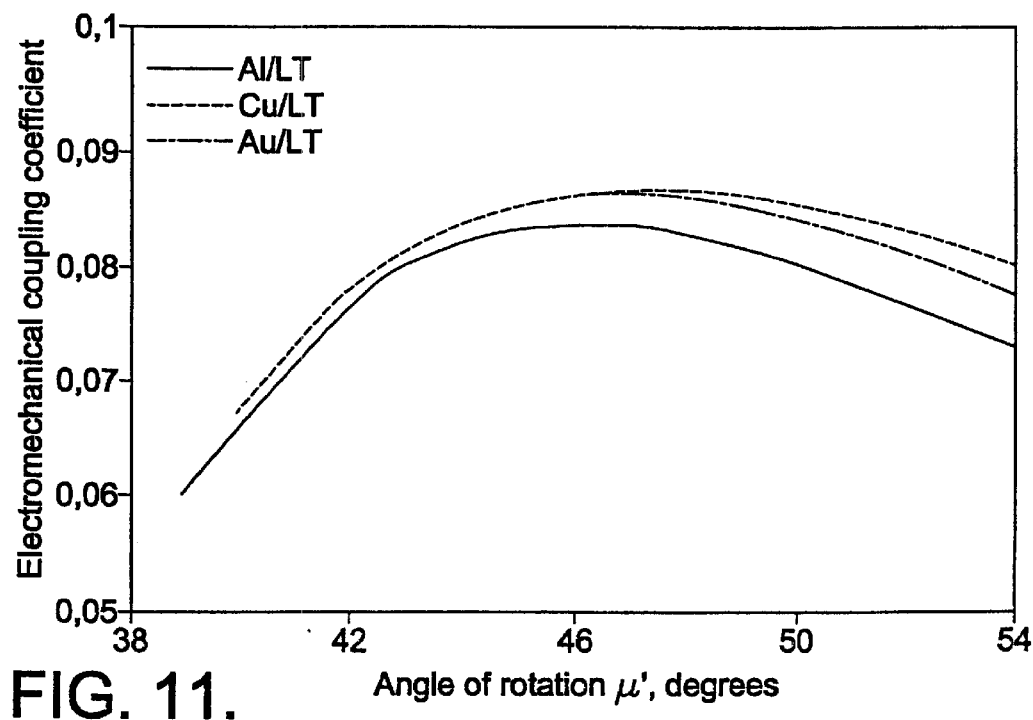
FIG. 11 graphically shows electromechanical coupling coefficients corresponding to the optimized thickness versus rotation angle dependencies shown in FIG. 10, for μ'-rotated YX cuts of LiTaO$_3$ with Al, Cu and Au as primary components of electrode material.
Figure 12:
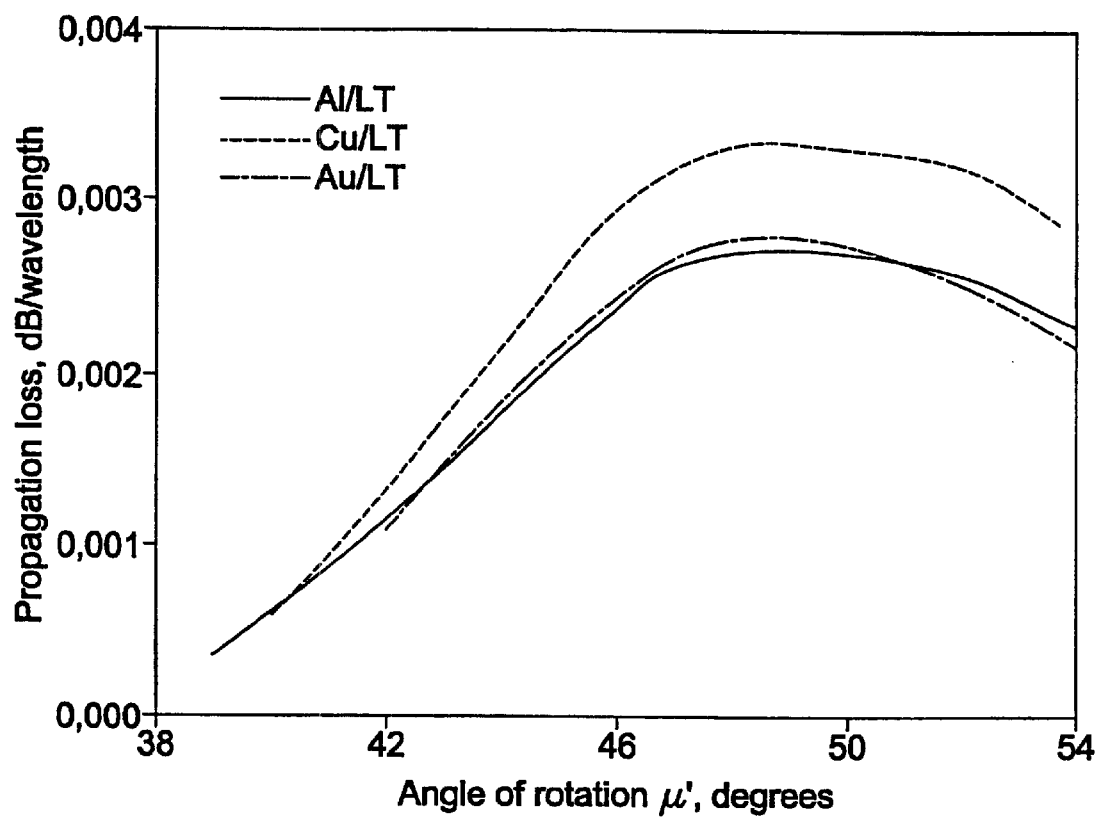
FIG. 12 graphically shows average propagation losses corresponding to the optimized thickness versus rotation angle dependencies shown in FIG. 10, for μ'-rotated YX cuts of LiTaO$_3$ with Al, Cu and Au as primary components of electrode material.

FIG. 9 shows the simulated electromechanical coupling coefficients k$^2$ for 36°YX, 42°YX and 48°YX cuts, as a function of electrode thickness. All dependencies have a maximum at approximately 10% Λ. With μ' increasing from 36° to 48°, piezoelectric coupling generally reduces. However, if an electrode thickness is optimized with respect to the cut angle μ' to provide minimum average propagation loss, then a maximum piezoelectric coupling, k$^2$=0.082, occurs for μ'=48° and h/Λ=10%, as illustrated in FIGS. 10–12. FIG. 10 shows the optimal relations between electrode thickness and cut angle for SAW devices having Al, Cu or Au as a primary component of electrode material, and FIGS. 11 and 12 show respectively electromechanical coupling coefficient and propagation loss Lr=La as functions of cut angle, with thickness optimized according to FIG. 10. With Al as electrode material, maximum coupling k$^2$=0.083 occurs at μ'≈46.5° and thickness about 9% Λ, while propagation loss is 0.0025 dBΛ. With Au as electrode material, maximum coupling k$^2$=0.086 occurs for μ'≈47° with optimized thickness about 1.6% Λ, and for Cu as electrode material, maximum coupling k$^2$=0.086 occurs for μ'≈47° with optimized thickness about 3.6% Λ.

Thus, according to FIGS. 10–12, for a grating with Al electrode thickness from 8% Λ to 13% Λ for the case with the first and third Euler angles (λ and θ) fixed at (nominally) zero, the optimal rotational angle μ' was found to be greater than 46° but less than 54°. For the same case, with Au as a primary component of electrode material, the optimal rotational angle μ' was found to be greater than 46° but less than 54° when electrode thickness changes within the range from 1.5% Λ to 2.5% Λ, and with Cu as a primary component of electrode material, the optimal rotational angle μ' was found to be greater than 46° but less than 54°, when electrode thickness changes within the range from 3% Λ to 6% Λ. A preferred embodiment of the present invention has the value of μ' nominally equal to 48°, or Euler angles (0°, −42°, 0°).

Figure 1:
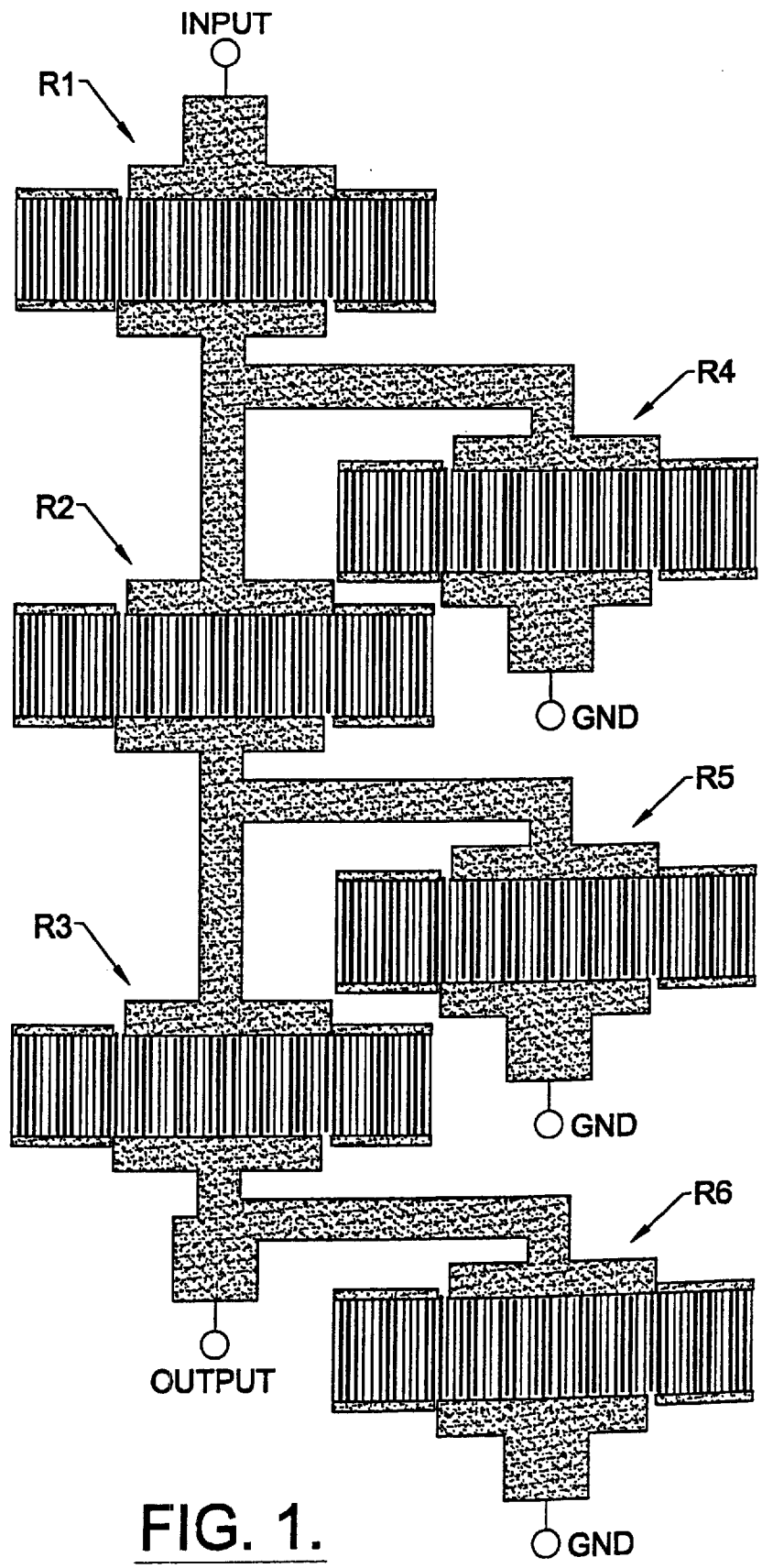
FIG. 1 is a schematic diagram of ladder filter as an example of a filter in which propagation losses need to be minimized simultaneously at resonant and anti-resonant frequencies.
Figure 2:
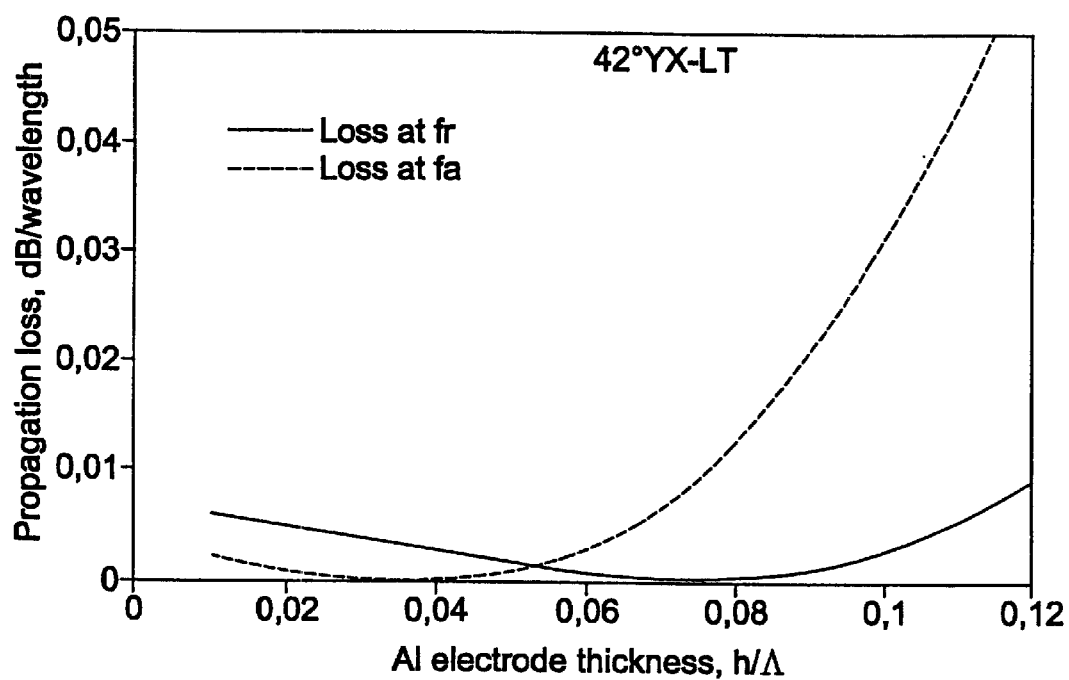
FIG. 2 graphically shows propagation losses at resonant and anti-resonant frequencies, for LSAW on 42°-rotated YX cut of LiTaO$_3$, as functions of Al electrode thickness normalized to wavelength.
Figure 3:
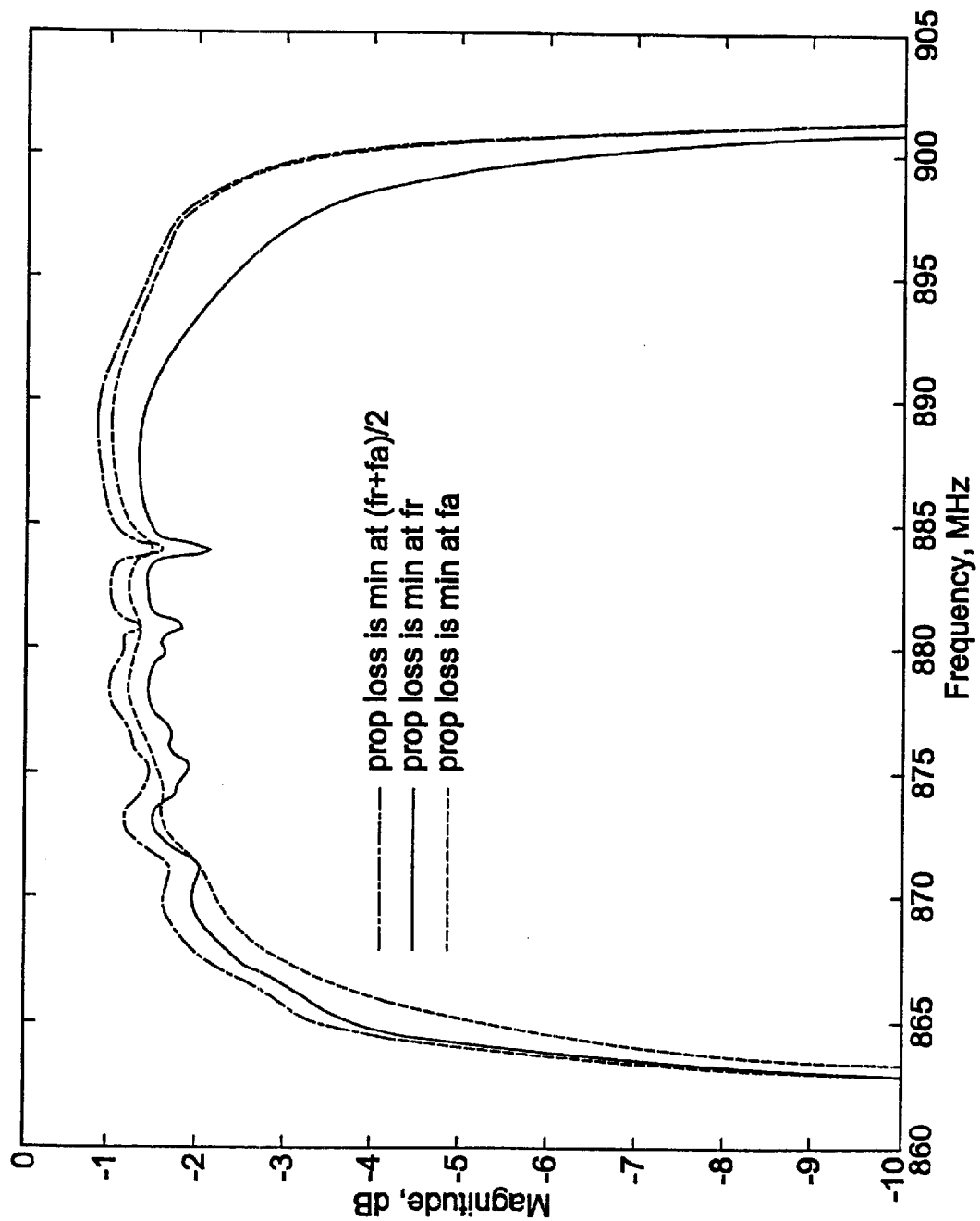
FIG. 3 is a diagram schematically illustrating an effect of increased propagation loss at resonant or at anti-resonant frequency on ladder SAW filter performance.
Figure 13:
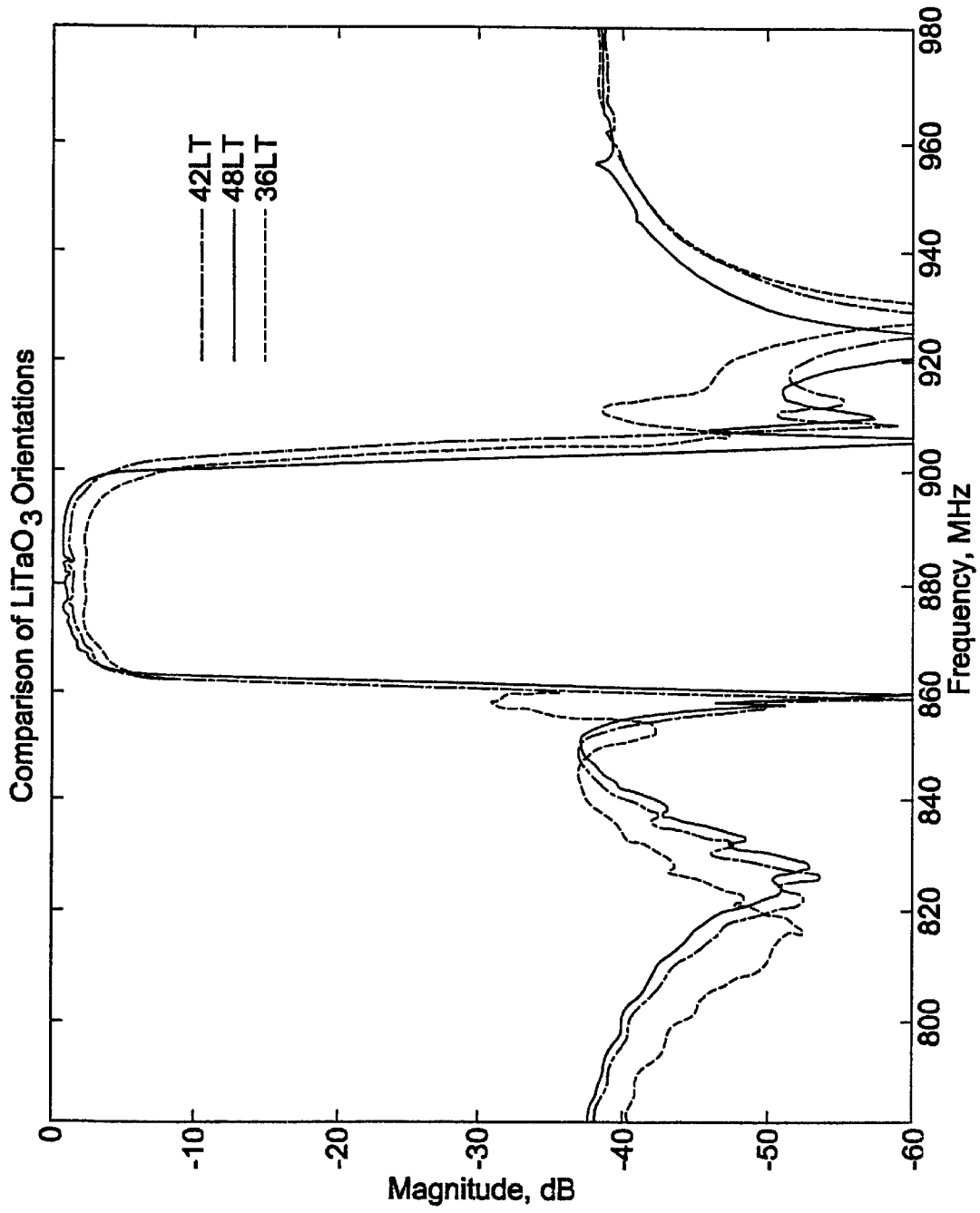
FIG. 13 is a diagram showing SAW filter frequency responses of three filters, constructed according to FIG. 1 on substrates of 36°YX, 42°YX and 48°YX cuts of LiTaO$_3$.
Figure 14:
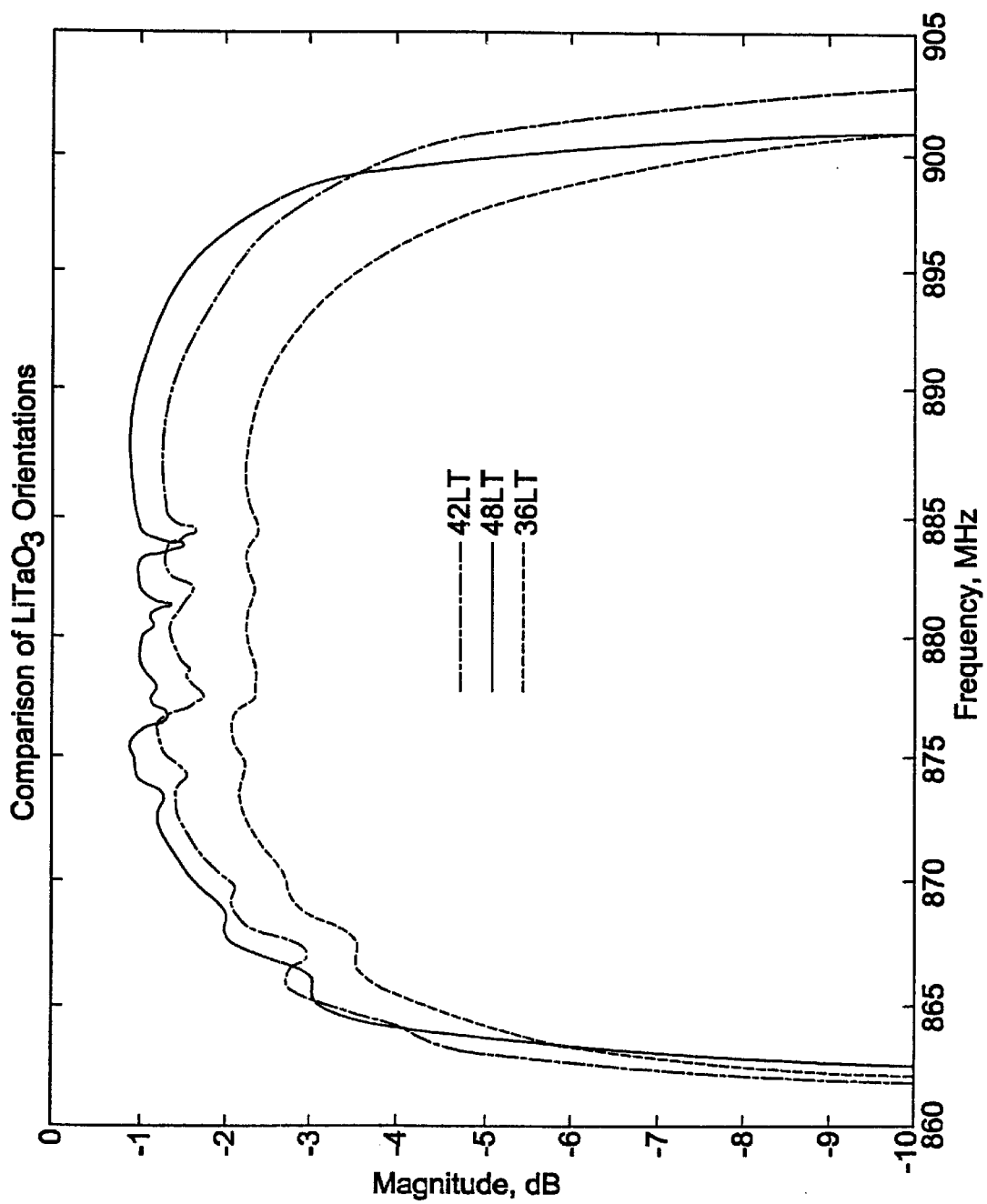
FIG. 14 is an enlarged portion of a diagram shown in FIG.13, including filter passband.

The comparison of simulated frequency responses of three ladder filter having structure according to FIG. 1 and disposed on the surface of 36°YX, 42°YX or 48°YX cuts of LiTaO$_3$ is demonstrated in FIG. 13, with enlarged view of the bandwidth shown in FIG. 14. Electrode patterns with thickness 10% Λ utilize Al as a primary component. The 48°-YX cut provides lower insertion loss and better shape factor, compared to 36°YX and 42°YX cuts, due to optimized average propagation loss in a passband.

As discussed above, deviation of crystal orientation from a symmetric cut (0°, μ, 0°) does not necessarily cause a significant increase of propagation loss, provided that deviation of a substrate plane is followed by proper rotation of propagation direction within this plane. Therefore, more general search, including non-symmetric cuts, resulted in the discovery of a broader range of orientations with desirable propagation characteristics and power flow angle non-zero but relatively small and thus manageable during device design. With Euler angle μ fixed within the interval from −52° to −36°, the search spanned a range of angles λ and θ from −5° to 5°. For each analyzed μ, electrode thickness was set to be optimal, according to relation shown in FIG. 10.

Figure 15:
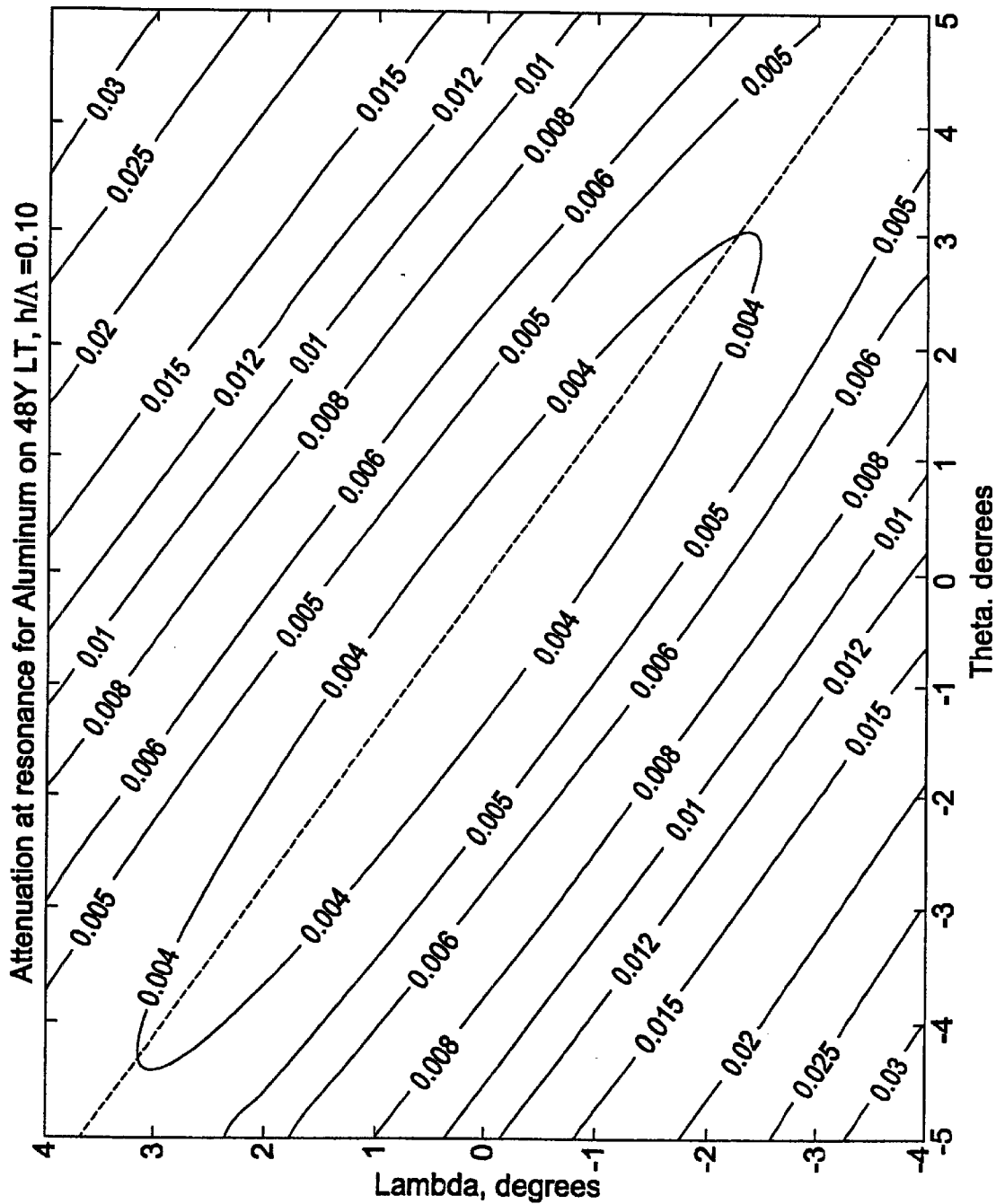
FIG. 15 is a contour plot of propagation loss at resonant frequency, as a function of angles λ and θ, for a pattern of Al electrodes with thickness 10% Λ, disposed on LiTaO$_3$ substrates defined by Euler angles (λ, −42°, θ), and wherein a line of optimal non-symmetric orientations θ=−1.365λ is shown.
Figure 16:
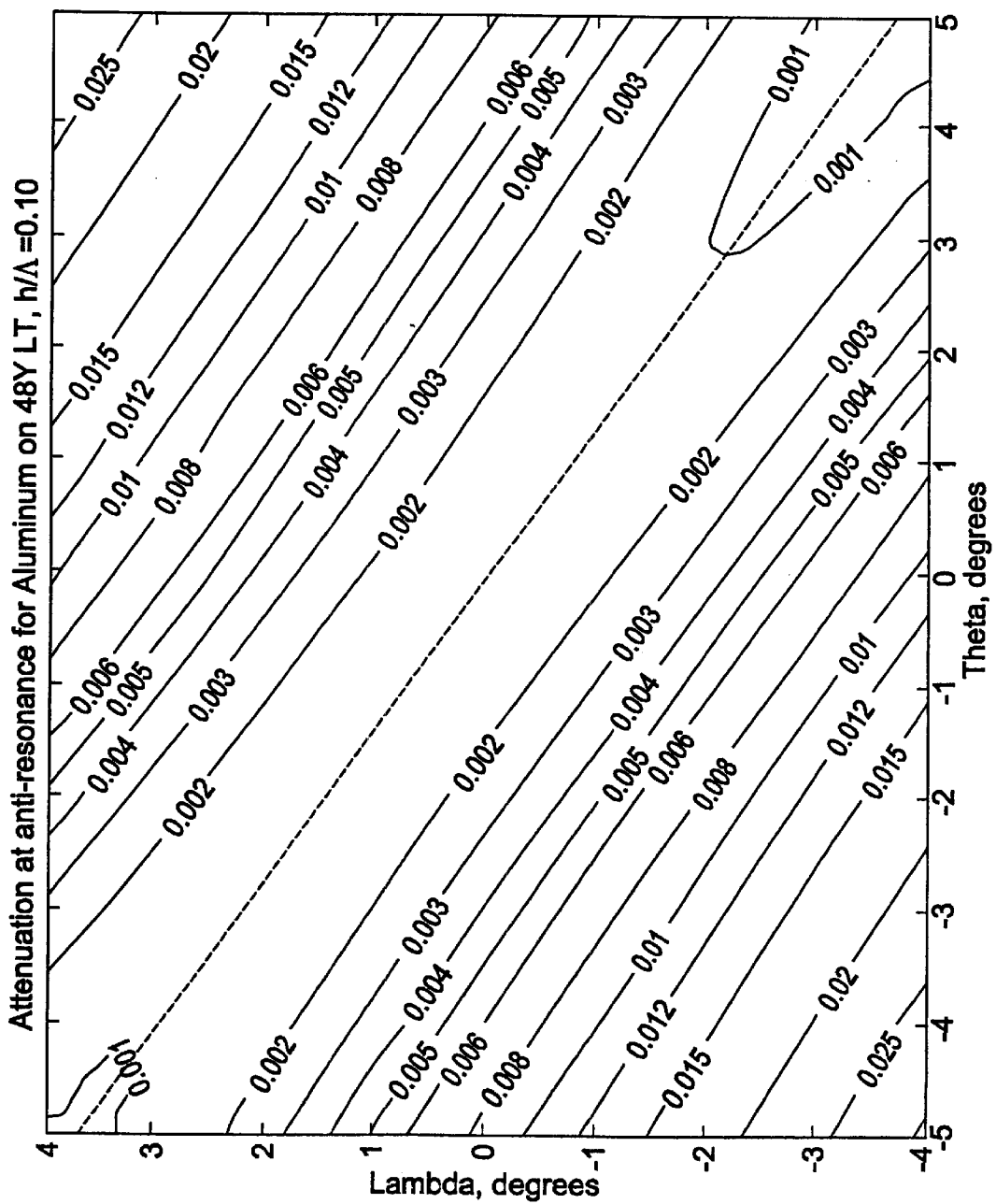
FIG. 16 is a contour plot of propagation loss at anti-resonant frequency, as a function of angles λ and θ, for pattern of Al electrodes with thickness 10% Λ, disposed on LiTaO$_3$ substrates defined by Euler angles (λ, −42°, θ), wherein a line of optimal non-symmetric orientations θ=−1.365λ is shown.
Figure 17:
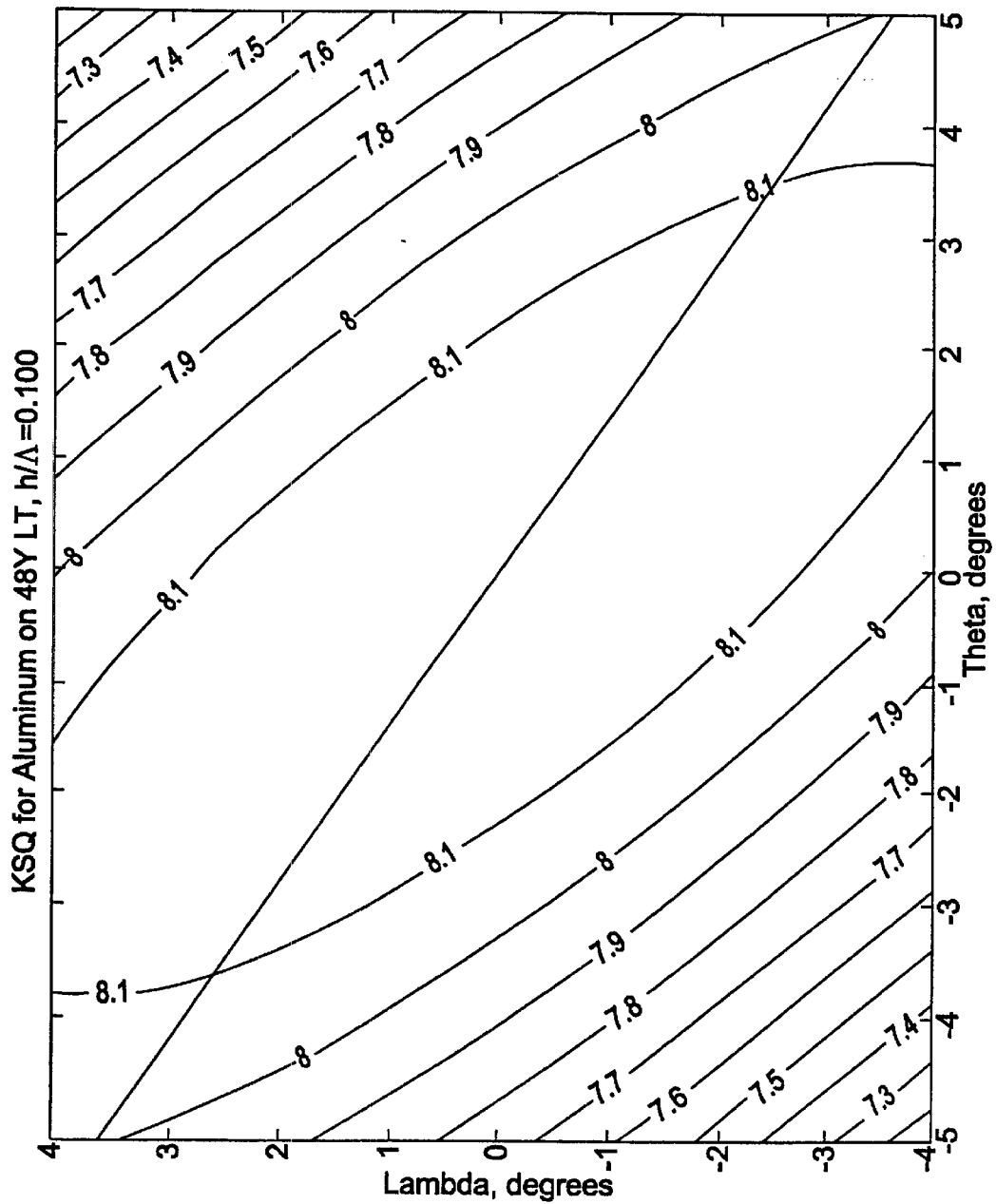
FIG. 17 is a contour plot of electromechanical coupling coefficient, as a function of angles λ and θ, for pattern of Al electrodes with thickness 10% Λ, disposed on LiTaO$_3$ substrates defined by Euler angles (λ, −42°, θ), wherein a line of optimal non-symmetric orientations θ=−1.365λ is shown.
Figure 18:
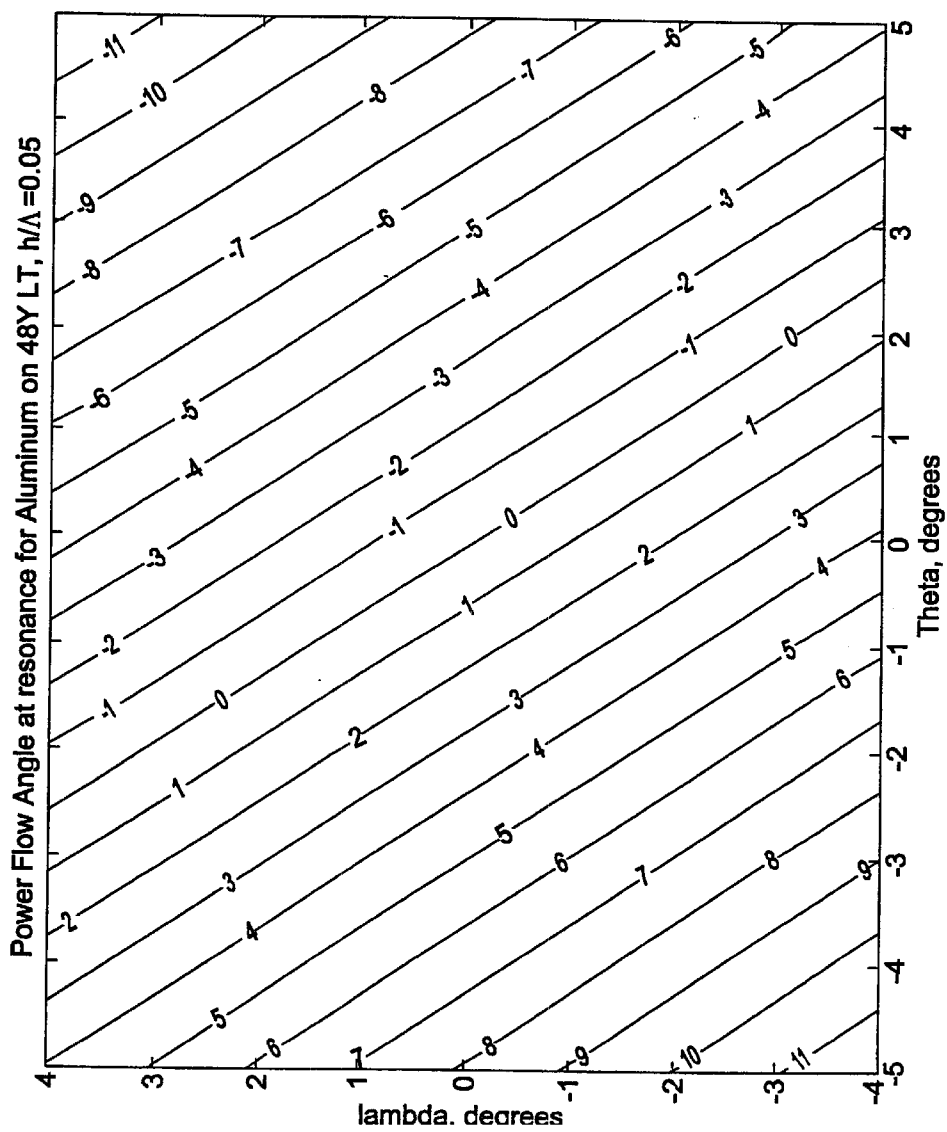
FIG. 18 is a contour plot of power flow angle, as a function of angles λ and θ, for a pattern of Al electrodes with thickness 10% Λ, disposed on LiTaO$_3$ substrates defined by Euler angles (λ, −42°, θ)

By way of example, orientations with Euler angles (λ, −42°, θ), (μ'=48°) will be further discussed. Al is utilized as electrode material, with optimized electrode thickness 10% Λ. Contour plots of propagation loss at resonant and anti-resonant frequencies, electromechanical coupling coefficient and power flow angle (FIGS. 15,16,17 and 18 respectively), show LSAW characteristics as functions of angles λ and θ. The lines of minimum propagation loss in FIG. 15 and FIG. 16 (again illustrated by dashed lines) nearly coincide and can be described by the following relationship: θ=−1.365*λ. In any orientation described by the aforementioned relationship, with λ larger than −4° and smaller than +4°, propagation losses at resonant and anti-resonant frequencies do not exceed 0.003 dB/Λ and $K^2$ is higher than 8%. These values are close to that of symmetric orientation (0°, −42°, 0°), i.e., the 48% YX cut. The absolute value of power flow angle grows with increasing λ but does not exceed 5° when −4°<λ<4°.

Figure 19:
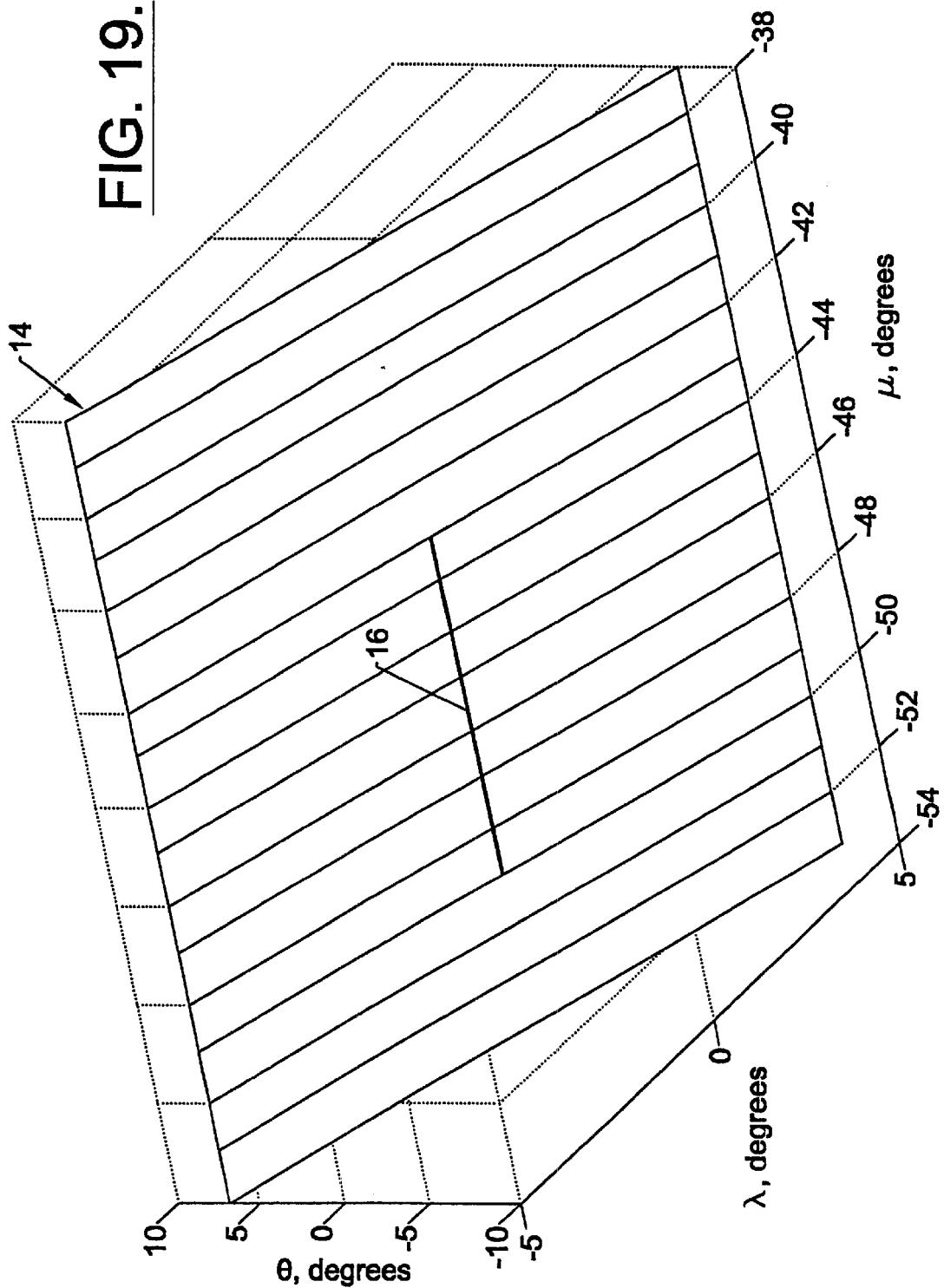
FIG. 19 is a plot of Euler angles λ, μ, θ, illustrating a resulting plane of Euler angles to achieve a desirable surface for optimizing SAW device performance.

Unlike the teachings typical in the art, the present invention as herein described by way of example, illustrates acceptable values of Euler angles λ, μ, θ that fall within a plane 14 such as described by way of example with reference to FIG. 19 and not a set of Euler angles that must be confined to a line 16 such as has been described in the art, by way of example in the Ueda '847 and '869 patents.

Figure 20:
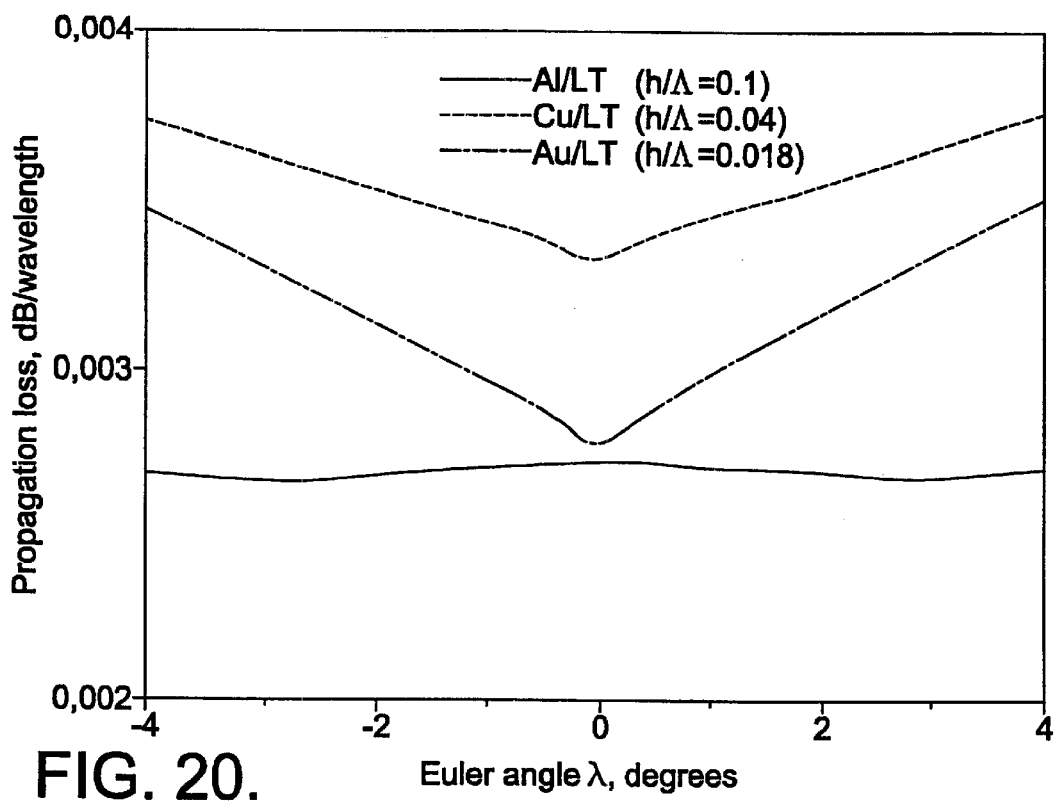
FIG. 20 graphically shows average propagation losses in orientations defined by Euler angles (λ, −42°, −1.365*λ) for three patterns, with Al electrodes of 10% Λ thickness, with Cu electrodes of 4% Λ thickness, and with Au electrodes of 1.8% Λ thickness.
Figure 21:
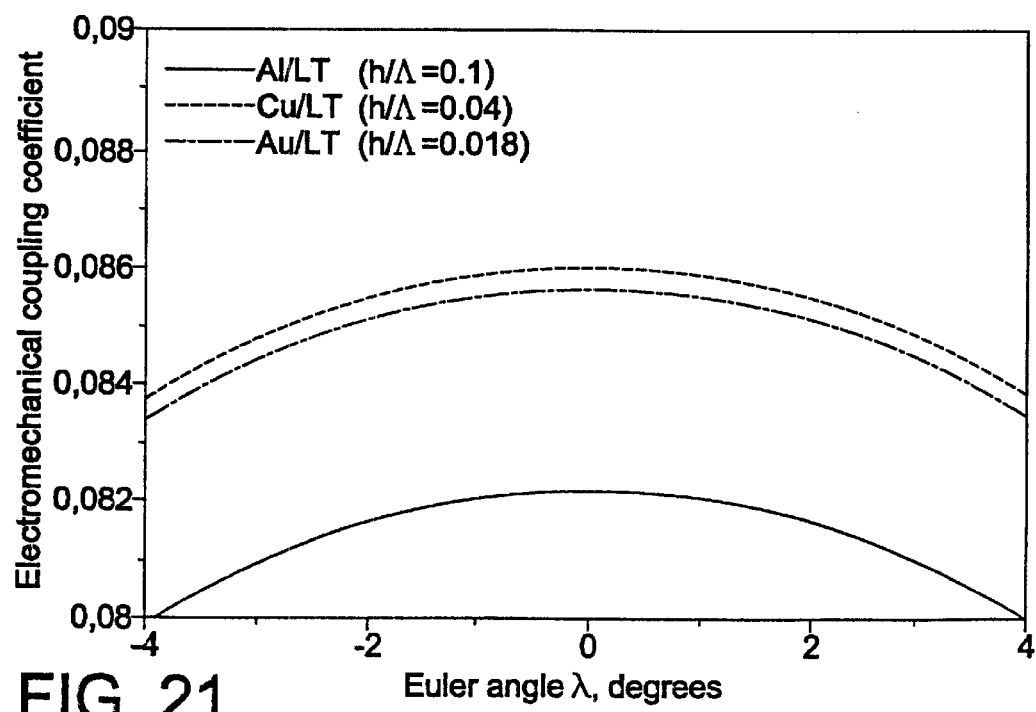
FIG. 21 graphically shows electromechanical coupling coefficients in orientations defined by Euler angles (λ, −42°, −1.365*λ) for three patterns, with Al electrodes of 10% Λ thickness, with Cu electrodes of 4% Λ thickness, and with Au electrodes of 1.8% Λ thickness.
Figure 22:
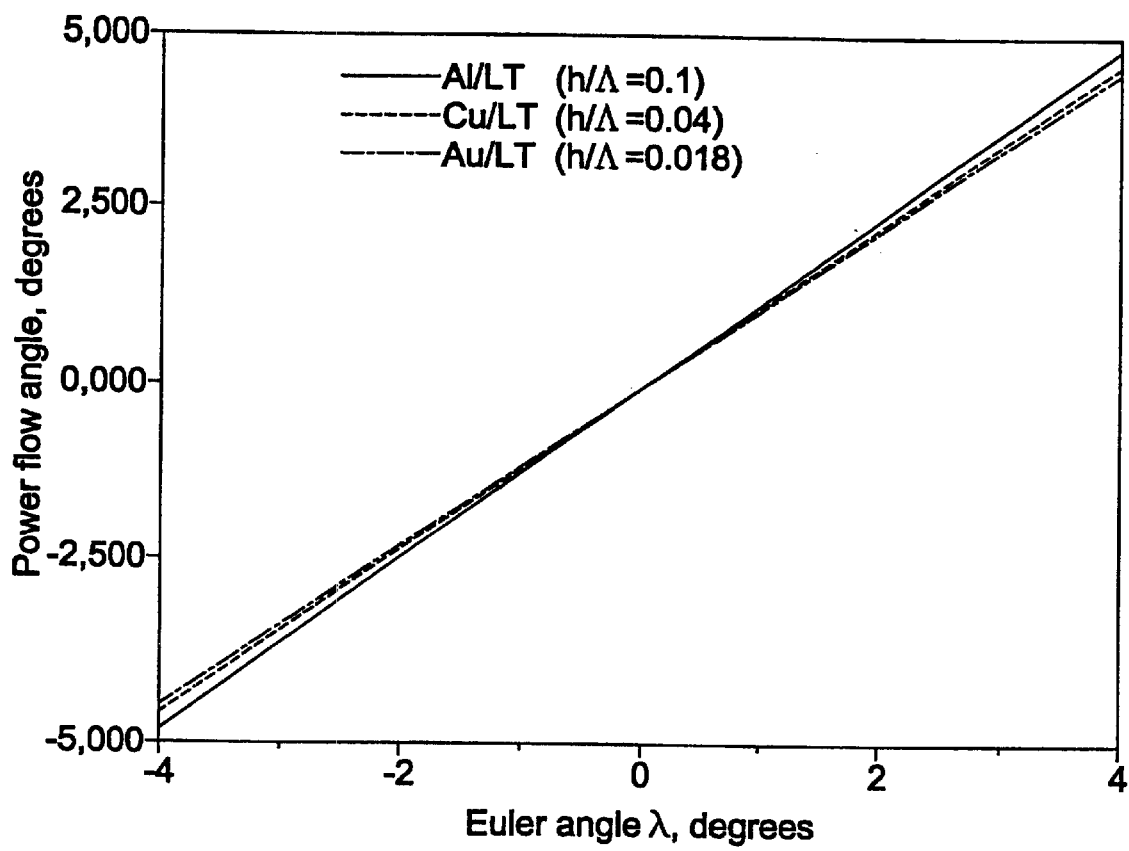
FIG. 22 graphically shows power flow angles of LSAW in orientations defined by Euler angles (λ, −42°, −1.365*λ) for three patterns, with Al electrodes of 10% Λ thickness, with Cu electrodes of 4% Λ thickness, and with Au electrodes of 1.8% Λ thickness.

Further analysis shows that the relationship θ=−1.365*λ adequately describes non-symmetric lines θ (λ) for any μ fixed in the interval from −52° to −36°, if electrode thickness is set optimal for each μ, according to FIG. 10, to provide minimum average propagation loss. Moreover, the same relationship can be referred to non-symmetric lines of optimal orientations (λ,μ,θ) with μ fixed in the interval from −52° to −36°, when Au or Cu is a primary component of electrode material. This is illustrated by FIGS. 20, 21, and 22 showing respectively average propagation loss, electromechanical coupling coefficient and power flow angle versus angle λ, for LiTaO₃ orientations (λ, −42°, −1.365*λ) with patterns of Al electrodes of 10% Λ, Cu electrodes of 4% Λ thickness, and Au electrodes of 1.8% Λ thickness. In all three cases, LSAW characteristics change very slowly with λ and therefore average propagation loss does not exceed 0.004 dB/Λ and k2 is greater than 8%, if −4°<λ<4°, while absolute value of power flow angle is less than 5°.

Thus, for the case of nonzero first and third Euler angles, the first Euler angle λ is set to be non-zero and less than 4° by its absolute value. A nominal value for λ would be λ=+2°. The second Euler angle μ can be selected within a fairly wide range such that μ is greater than −52° but less than −36°. A preferred embodiment of this second invention restricts the second Euler angle such that μ is greater than −44° and less than −36°. The third Euler angle, θ, has a fixed relationship to the first Euler angle, θ=−1.365*λ. Thus, the nominal value for θ in a preferred embodiment is θ=−2.73°.

It is to be understood that even though numerous characteristics and advantages of the present invention have been set forth in the foregoing description, together with details of the structure and function of the invention, the disclosure is illustrative only, and changes may be made in detail, especially in the choice of type of SAW device, device orientation on the die, and shape size and arrangement of parts within the principles of the invention to the full extent indicated by the broad general meaning of the terms in which the appended claims are expressed. For example, the term Al as a primary component of electrode material should cover alloys using Al as a primary component.

That which is claimed is:

1. A surface acoustic wave device comprising:
   a piezoelectric substrate of a single crystal LiTaO₃; and
   an electrode pattern provided on a surface of said piezoelectric substrate, wherein said electrode pattern forms a resonator having an electrode thickness in a range of about 1% Λ to about 15% Λ, where Λ is an acoustic wavelength of a surface acoustic wave excited on said surface of said piezoelectric substrate, and wherein said piezoelectric substrate has an orientation defined by Euler angles (λ, μ, θ), with angle λ in a range from −4° to +4°, angle μ in a range from about −52° to about −36°, and angle θ in a range from about (−1.365 λ−4)° to (−1.365 λ+4)°, wherein one of said angle λ and θ is not equal to zero degrees.

2. A surface acoustic wave device as recited in claim 1, wherein λ has a value of about +2°, angle μ is greater than −44° and less than −36°, and angle θ has a fixed relation to λ such that θ is defined as having a value of approximately −1.365 λ.

3. A surface acoustic wave device as recited in claim 2, wherein θ=−2.73°.

4. A surface acoustic wave device as recited in claim 1, wherein a primary material component of said electrode comprises Al.

5. A surface acoustic wave device as recited in claim 1, wherein a primary material component of said electrode comprises Au, and wherein said electrode thickness ranges from about 1% Λ to about 2.5% Λ.

6. A surface acoustic wave device as recited in claim 1, wherein a primary material component of said electrode comprises Cu, and wherein said electrode thickness ranges from about 1% Λ to about 6% Λ.

7. A surface acoustic wave device comprising:
   a piezoelectric substrate of a single crystal LiTaO₃; and
   an electrode pattern provided on a surface of said piezoelectric substrate, wherein said electrode pattern forms a resonator having an electrode thickness in a range of about 1% Λ to about 15% Λ, where Λ is an acoustic wavelength of a leaky surface acoustic wave which predominately comprises a shear wave component excited on said surface of said piezoelectric substrate, and wherein
   said piezoelectric substrate has a non-symmetric orientation defined by Euler angles (λ, μ, θ), wherein one of said angle λ and θ is not equal to zero degrees, and characteristics include a propagation loss less than 0.01 dB/Λ, and an electromechanical coupling factor greater than 0.07.

8. A surface acoustic wave device comprising:

a piezoelectric substrate of a single crystal LiTaO$_3$; and an electrode pattern provided on a surface of said piezoelectric substrate, wherein said electrode pattern forms a resonator having an electrode thickness in a range of about 5% Λ to about 15% Λ, where Λ is an acoustic wavelength of a surface acoustic wave excited on said surface of said piezoelectric substrate, and wherein a primary material component of said electrode comprises Al, and wherein said piezoelectric substrate has an orientation defined by Euler angles (λ, μ, θ), with angle λ at or about 0°, angle μ in a range from greater than −44° to less than or equal to −36°, and angle θ at or about 0°.

9. A surface acoustic wave device comprising:

a piezoelectric substrate of a single crystal LiTaO$_3$; and an electrode pattern provided on a surface of said piezoelectric substrate, wherein said electrode pattern forms a resonator having an electrode thickness in a range of about 1.5% Λ to about 2.5% Λ, where Λ is an acoustic wavelength of a surface acoustic wave excited on said surface of said piezoelectric substrate, and wherein a primary material component of said electrode comprises Au, and wherein said piezoelectric substrate has an orientation defined by Euler angles (λ, μ, θ), with angle λ at or about 0°, angle μ in a range from greater than −44° to less than or equal to −36°, and angle θ at or about 0°.

10. A surface acoustic wave device comprising:

a piezoelectric substrate of a single crystal LiTaO$_3$; and an electrode pattern provided on a surface of said piezoelectric substrate, wherein said electrode pattern forms a resonator having an electrode thickness in a range of about 3% Λ to about 6% Λ, where Λ is an acoustic wavelength of a surface acoustic wave excited on said surface of said piezoelectric substrate, and wherein a primary material component of said electrode comprises Cu, and wherein said piezoelectric substrate has an orientation defined by Euler angles (λ, μ, θ), with angle λ at or about 0°, angle μ in a range from greater than −44° to less than or equal to −36°, and angle θ at or about 0°.

11. A surface acoustic wave device comprising a piezoelectric substrate of a single crystal LiTaO$_3$, wherein said piezoelectric substrate has a surface orientation defined by Euler angles (λ, μ, θ), with angle λ in a range from −4° to +4°, angle μ in a range from about −52° to about −36°, and angle θ in a range from about (−1.365 λ−4)° to (−1.365 λ+4)°, wherein one of said angle λ and θ is not equal to zero degrees.

12. A surface acoustic wave device as recited in claim 11, further comprising an electrode pattern on said surface formed from electrodes having Al as a primary material component, wherein said electrode pattern forms a resonator having an electrode thickness in a range of about 1% Λ to about 15% Λ, where Λ is an acoustic wavelength of a surface acoustic wave excited on said surface of said piezoelectric substrate.

13. A surface acoustic wave device as recited in claim 11, further comprising an electrode pattern on said surface formed from electrodes having Au as a primary material component, wherein said electrode pattern forms a resonator having an electrode thickness in a range of about 1% Λ to about 2.5% Λ, where Λ is an acoustic wavelength of a surface acoustic wave excited on said surface of said piezoelectric substrate.

14. A surface acoustic wave device as recited in claim 11, further comprising an electrode pattern on said surface formed from electrodes having Cu as a primary material component, wherein said electrode pattern forms a resonator having an electrode thickness in a range of about 1% Λ to about 6% Λ, where Λ is an acoustic wavelength of a surface acoustic wave excited on said surface of said piezoelectric substrate.

15. A leaky surface acoustic wave piezoelectric substrate of a single crystal LiTaO$_3$, wherein said piezoelectric substrate includes a surface having an orientation defined by Euler angles (λ, μ, θ), with angle λ in a range from −4° to +4°, angle μ in a range from about −52° to about −36°, and angle θ in a range from about (−1.365 λ−4)° to (−1.365 λ+4)°, wherein one of said angle λ and θ is not equal to zero degrees.

16. A leaky surface acoustic wave piezoelectric substrate as recited in claim 15, wherein λ has a value of about +2°, angle μ is greater than −44° and less than −36°, and angle θ has a fixed relation to λ such that θ is defined as having a value of approximately −1.365 λ.

17. A leaky surface acoustic wave piezoelectric substrate as recited in claim 16, wherein θ=−2.73°.

18. A leaky surface acoustic wave piezoelectric substrate of a single crystal LiTaO$_3$, wherein said piezoelectric substrate includes a surface having an orientation defined by Euler angles (λ, μ, θ) with angle λ set at or about zero, angle μ in a range from greater than −44° to less than or equal to −36°, and angle θ at or about zero.

19. A surface acoustic wave device comprising:

a piezoelectric substrate of a single crystal LiTaO$_3$; and an electrode pattern provided on a surface of said piezoelectric substrate, wherein said electrode pattern forms a plurality of resonators, said plurality of resonators being arranged in either a series arm or a parallel arm forming a ladder type or a lattice type filter, each said resonator having a resonant frequency and an anti-resonant frequency, and the propagation loss of at least one of the resonators being less than 0.01 dB/Λ at about the resonant frequency and at about the anti-resonant frequency, each of said plurality of resonators having an electrode thickness in the range of 9%Λ to 15%Λ, where Λ is an acoustic wavelength of a surface acoustic wave excited on said substrate, and wherein a primary material component of said electrode comprises Al, and wherein said piezoelectric substrate has an orientation defined by Euler angles (λ, μ, θ), with angle λ equals about 0°, angle θ equals about 0°, and angle μ is in the range of −45° to −36°.

* * * * *